United States Patent
Isikgor et al.

(10) Patent No.: US 12,369,489 B2
(45) Date of Patent: Jul. 22, 2025

(54) CONCURRENT CATIONIC AND ANIONIC METAL HALIDE PEROVSKITE DEFECT PASSIVATION METHOD AND DEVICE

(71) Applicant: KING ABDULLAH UNIVERSITY OF SCIENCE AND TECHNOLOGY, Thuwal (SA)

(72) Inventors: Furkan Halis Isikgor, Thuwal (SA); Stefaan De Wolf, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 18/037,652

(22) PCT Filed: Nov. 29, 2021

(86) PCT No.: PCT/IB2021/061074
§ 371 (c)(1),
(2) Date: May 18, 2023

(87) PCT Pub. No.: WO2022/113038
PCT Pub. Date: Jun. 2, 2022

(65) Prior Publication Data
US 2023/0403870 A1  Dec. 14, 2023

Related U.S. Application Data

(60) Provisional application No. 63/119,229, filed on Nov. 30, 2020.

(51) Int. Cl.
*H10K 30/88* (2023.01)
*H10K 10/46* (2023.01)
(Continued)

(52) U.S. Cl.
CPC .......... *H10K 85/50* (2023.02); *H10K 10/484* (2023.02); *H10K 10/88* (2023.02); *H10K 30/57* (2023.02);
(Continued)

(58) Field of Classification Search
CPC ...... H01L 31/00–078; Y02E 10/50–60; H10K 30/00–89
(Continued)

(56) References Cited

U.S. PATENT DOCUMENTS

2021/0175450 A1* 6/2021 Kim .................. H10K 71/40
2023/0050607 A1* 2/2023 Andriessen .......... H01L 31/048

FOREIGN PATENT DOCUMENTS

WO    WO-2019098527 A1 *  5/2019  ......... H01L 31/0392

OTHER PUBLICATIONS

Zhu et al. Enhanced Perovskite Solar Cell Performance via Defect Passivation with Ethylamine Alcohol Chlorides Additive, Journal of Power Sources, 428, 2019, 82-87 (Year: 2019).*

(Continued)

*Primary Examiner* — Bach T Dinh
(74) *Attorney, Agent, or Firm* — PATENT PORTFOLIO BUILDERS PLLC

(57) ABSTRACT

A semiconductor device includes a substrate, a first electrode located on the substrate, a metal halide perovskite layer located on the first electrode, a second electrode located on the metal halide perovskite layer, and passivation molecules that passivate the metal halide perovskite layer. The metal halide perovskite layer has (1) a top surface defect located in a top surface and (2) an inter-grain defect located at an interface between two adjacent grains, and the passivation molecules passivate at least one of the top surface defect and the inter-grain defect.

16 Claims, 32 Drawing Sheets

(51) Int. Cl.
| | |
|---|---|
| *H10K 10/88* | (2023.01) |
| *H10K 30/57* | (2023.01) |
| *H10K 85/50* | (2023.01) |
| *H10K 30/20* | (2023.01) |
| *H10K 30/50* | (2023.01) |

(52) U.S. Cl.
CPC ............ *H10K 30/88* (2023.02); *H10K 30/20* (2023.02); *H10K 30/50* (2023.02)

(58) Field of Classification Search
USPC .................................................. 136/243–265
See application file for complete search history.

(56) References Cited

OTHER PUBLICATIONS

Yang et al., Tailoring Passivation Molecular Structures for Extremely Small Open-Circuit Voltage Loss in Perovskite Solar Cells, Journal of the American Chemical Society, 2019, 141, 5781-5787 (Year: 2019).*

De Bastiani, M., et al., "Recombination Junctions for Efficient Monolithic Perovskite-Based Tandem Solar Cells: Physical Principles, Properties, Processing and Prospects," Materials Horizons, Sep. 11, 2020, vol. 7, pp. 2791-2809.

Gao, F., et al., Recent Progresses on Defect Passivation Toward Efficient Perovskite Solar Cells,: Advanced Energy Materials, 2020, vol. 10, pp. 1902650 (1-30), WILEY-VCH Verlag Gmbh & Co.

Gharibzadeh, S., et al., "Record Open-Circuit Voltage Wide-Bandgap Perovskite Solar Cells Utilizing 2D/3D Perovskite Heterostructure," Advanced Energy Materials, Apr. 24, 2019, vol. 9, pp. 1803699 (1-10), WILEY-VCH Verlag GmbH & Co.

Hu, Y., et al., "Hybrid Perovskite/Perovskite Heterojunction Solar Cells," ACS Nano, Jun. 3, 2016, vol. 10, No. 6, pp. 5999-6007.

International Search Report in corresponding/related International Application No. PCT/IB2021/061074, date of mailing Mar. 4, 2022.

Isikgor, F.H., et al., "Concurrent Cationic and Anionic Perovskite Defect Passivation Enables 27.4% Perovskite/Silicon Tandems with Suppression of Halide Segregation," JOULE, Jun. 1, 2021, vol. 5, No. 6, pp. 1566-1586, Elsevier Inc.

Ke, W., et al., "Compositional and Solvent Engineering in Dion-Jacobson 2D Perovskites Boosts Solar Cell Efficiency and Stability," Advanced Energy Materials, Jan. 21, 2019, vol. 9, pp. 1803384 (1-11), WILEY-VCH Verlag GmbH & Co.

Li, M.-H., et al., "Highly Efficient 2D/3D Hybrid Perovskite Solar Cells via Low-Pressure Vapor-Assisted Solution Process," Advanced Materials, Jun. 8, 2018, vol. 30, pp. 1801401 (1-13), WILEY-VCH Verlag Gmbh & Co.

Wang, Z., et al., "Efficient Ambient-Air-Stable Solar Cells with 2D-3D Heterostructured Butylammonium-Caesium-Formamidinium Lead Halide Perovskites," Nature Energy, Aug. 14, 2017, vol. 2, No. 17135, pp. 1-10, Maxmillan Publishers Limited.

Written Opinion of the International Searching Authority in corresponding/related International Application No. PCT/IB2021/061074, date of mailing Mar. 4, 2022.

Zaher, A., et al., "Osmotically Driven Drug Delivery Through Remote-Controlled Magnetic Nanocomposite Membranes", Biomicrofluidics, Sep. 2015, vol. 9, No. 5, p. 054113-1-054113-16, AIP Publishing LLC.

Zhu, K., et al., "Enhanced Perovskite Solar Cell Performance via Defect Passivation with Ethylamine Alcohol Chlorides Additive," Journal of Power Sources, May 9, 2019, vol. 428, pp. 82-87.

Zhu, K., et al., "Enhanced Perovskite Solar Cell Performance via Defect Passivation with Ethylamine Alcohol Chlorides Additive—Supporting Information," Journal of Power Sources, May 9, 2019, vol. 428, pp. 1-5.

* cited by examiner

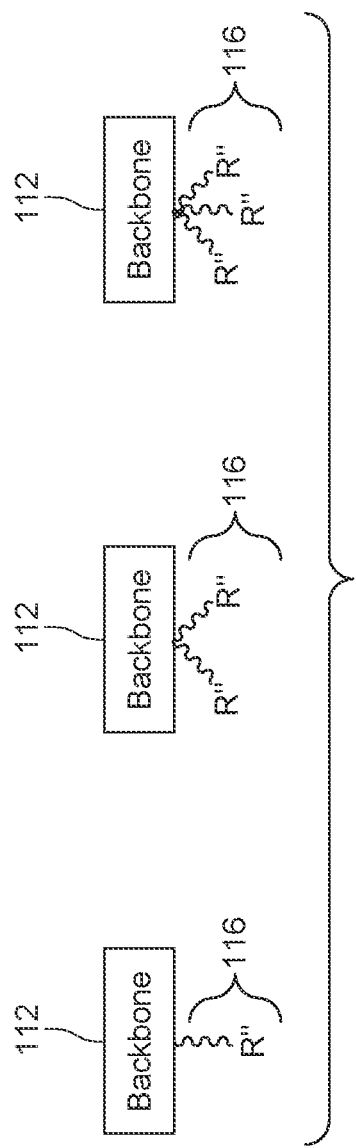

B.E.: -1.67 eV

B.E.: -3.84 eV

CONCURRENT CATIONIC AND ANIONIC METAL HALIDE PEROVSKITE DEFECT PASSIVATION METHOD AND DEVICE

CROSS-REFERENCE TO RELATED APPLICATIONS

This application is a U.S. National Stage Application of International Application No. PCT/IB2021/061074, filed on Nov. 29, 2021, which claims priority to U.S. Provisional Patent Application No. 63/119,229, filed on Nov. 30, 2020, entitled "CONCURRENT CATIONIC AND ANIONIC METAL HALIDE PEROVSKITE DEFECT PASSIVATION FOR SEMICONDUCTOR AND ELECTRONIC DEVICE APPLICATIONS," the disclosures of which are incorporated herein by reference in their entirety.

BACKGROUND

Technical Field

Embodiments of the subject matter disclosed herein generally relate to a process for defect passivation of a metal halide perovskite layer with a multi-functional molecule concurrently having electron-rich and -poor domains, and more particularly, to an electronic device having concurrent cationic and anionic defects in a metal halide perovskite layer, which are passivated with electron-rich and -poor multi-functional molecules.

Discussion of the Background

Lab-scale single-junction perovskite solar cells (PSCs) have reached certified power conversion efficiencies (PCEs) of 25.5%, approaching thereby the record of single-junction silicon solar cells (26.7%). The success of PSCs can be attributed to several intrinsic material properties of the halide perovskites, such as a high absorption coefficient, long carrier diffusion lengths, ambipolar transport, and low defect tolerance. Thanks to their extensive bandgap tunability, perovskite and silicon technologies can be integrated in a multi-junction configuration to surpass the single-junction Shockley-Queisser (S-Q) limit, which can lead to ultra-high performant photovoltaics at affordable cost. Specifically, wide-bandgap perovskites (1.65 eV-1.75 eV) built from mixed-halide compositions are critical enablers for efficient tandems, serving as the top-cells.

However, for commercial viability, the long-term stability of the mixed-halide compositions may be of concern because extrinsic stressors such as moisture, oxygen, thermal heat and irradiation may alter the material's composition. Such effects are highly predominant in wide-bandgap perovskites. For example, introducing bromine substituents for iodine in the perovskite crystal structure leads to phase segregation under light exposure. Known as the Hoke's effect, the segregation of wide-bandgap perovskite into different halide phases alters the bandgap of the material locally, compromising long-term stability and robustness. In the case of perovskite/silicon tandems, bandgap fluctuations furthermore may alter the current matching condition, and consequently, negatively affect the device's performance.

The ionic nature of the perovskites can feature various defect states, associated with uncoordinated $Pb^{2+}$ positive ions, $I^-/Br^-$ negative ions, as well as organic cation vacancies ($MA^+/FA^+$) and halide vacancies, which tend to accumulate at grain boundaries and perovskite interfaces. The defect states may result in charge trapping, non-radiative charge recombination and hysteresis, detrimentally affecting device performance. Under the influence of extrinsic stressors, the defect states lead to charge accumulation and ion migration, leading to disruptions in the material lattice. The cascading effect of defect states leads to long-term device stability and performance losses under PSCs' real-time operation.

One solution to these defects is defect passivation. The defect passivation of perovskite absorbers can aid in reduced recombination and enhanced device stability. Various strategies have been proposed recently to passivate the defects. For passivating bulk defects, various metal cations (e.g., $Na^+$, $Rb^+$, $K^+$, $Cd^{2+}$) are introduced to negate uncoordinated $I^-$ ions, I interstitials and negatively charge $PbI_3^-$ anti-sites; whereas, anions (e.g., thiocyanate ($SCN^-$), acetate ($COO^-$)) target Pb interstitials and halide vacancies. Certain additives can control perovskite films' nucleation process, leading to reduced grain boundaries (the boundaries can be correlated to trap densities) and larger grains F-functional groups of ionic additives also play a significant role in defect passivation and reducing the ion mobility. Lewis base additives such as urea, thiophene, poly(methyl methacrylate) (PMMA) and caffeine donate electrons (from nitrogen, oxygen, and sulfur atoms, respectively) to passivate the uncoordinated Lewis acid $Pb^{2+}$ cations. To passivate $I^-$ defects ($PbI_3^-$ anti-site defects), Lewis acid molecules such as [6,6]-phenyl-$C_{61}$-butyric acid methyl ester (PCBM) and zwitterion have been used. Surface and interface defects can also affect device performance, mandating specific passivation strategies. Treating the surface defects with additives such as PMMA, trioctylphosphine oxide (TOPO), and benzyl amine is known to mitigate phase segregation in wide-bandgap perovskites. Introducing a thin 2-D perovskite layer at the interface can also help alleviating such defects.

Overall, the surface chemistry of the perovskite material is crucial in defining adequate passivation strategies. However, most of the early passivation results were unpredictable, underlining the need for an improved understanding of the defects involved. The perovskite surface, being an ionic cocktail of positive and negative charges, is a strongly evolving interface subjected to processing details and ambient conditions. Nonetheless, in most cases, the volatile nature of the organic and halide species renders the surface lead-rich with uncoordinated $Pb^{2+}$ ions. Though most groups report larger organic molecules such as phenethylammonium iodide (PEAI), butylammonium iodide (BAI), and other organic ammonium cations to form a thin 2-D layer and passivate the defects [1]-[4], the positive molecules cannot effectively passivate the highly positive surface regions as the $Pb^{2+}$ rich surface is expected to repel them.

Thus, there is a need for a new method for defect passivating for electronic devices that use perovskite materials.

BRIEF SUMMARY OF THE INVENTION

According to an embodiment, there is a semiconductor device that includes a substrate, a first electrode located on the substrate, a metal halide perovskite layer located on the first electrode, a second electrode located on the metal halide perovskite layer, and passivation molecules that passivate the metal halide perovskite layer. The metal halide perovskite layer has (1) a top surface defect located in a top surface and (2) an inter-grain defect located at an interface between two adjacent grains. The passivation molecules passivate at least one of the top surface defect and the inter-grain defect.

According to another embodiment, there is a solar cell that includes a substrate, a first electrode located on the substrate, a hole transport layer located on the first electrode, a metal halide perovskite layer located on the hole transport layer, an electron transport layer located on the metal halide perovskite layer, a second electrode located on the electron transport layer, and passivation molecules that passivate the metal halide perovskite layer. The metal halide perovskite layer has (1) a top surface defect located in a top surface and (2) an inter-grain defect located at an interface between two adjacent grains. The passivation molecules passivate at least one of the top surface defect and the inter-grain defect.

According to still another embodiment, there is a method for passivating a semiconductor device, and the method includes preparing metal halide perovskite precursors, adding passivation molecules to the precursors to have a first concentration, forming a metal halide perovskite layer on a hole or electron transport layer, and solution processing a top surface of the metal halide perovskite layer with additional passivation molecules dissolved in a solvent, to form a passivation layer. The additional passivation molecules have a second concentration in the solvent, which is different from the first concentration.

BRIEF DESCRIPTION OF THE DRAWINGS

For a more complete understanding of the present invention, reference is now made to the following descriptions taken in conjunction with the accompanying drawings, in which:

FIGS. 2E and 2F illustrate the chemical composition of a head group of the passivation molecule;

FIG. 9 illustrates a schematic of a solution-processed perovskite/textured SHJ tandem solar cell architecture that includes a-Si:H(n), n-doped hydrogenated amorphous silicon; a-Si:H(i), intrinsic hydrogenated amorphous silicon; a-Si:H(p), p-doped hydrogenated amorphous silicon; SAM, 2PACz; PVK, perovskite layers while

DETAILED DESCRIPTION OF THE INVENTION

Figure 1:
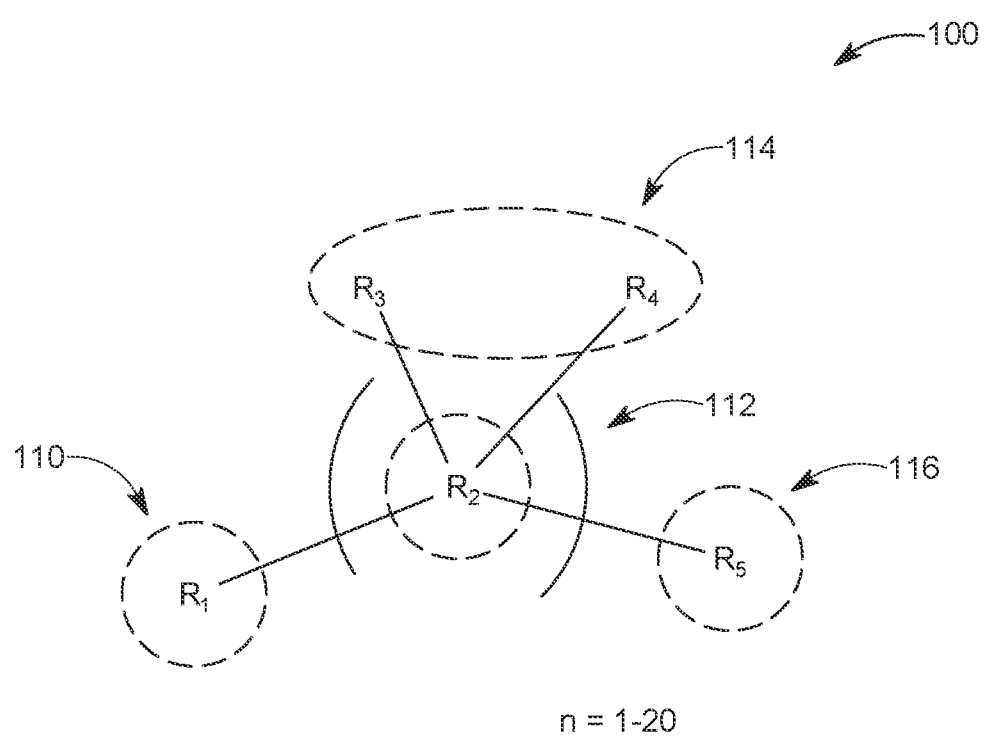
FIG. 1 is a schematic diagram of a passivation molecule.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to phenformin hydrochloride (PhenHCl) molecules for passivation, as these molecules include electro-negative amine and imine groups alongside an electro-positive ammonium head group. However, the embodiments to be discussed next are not limited to this type of molecules, but other molecules may be used for defect passivation.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a passivation molecule that effectively passivates the perovskite defects, both at the grain boundaries and top surface, is introduced and this molecule is appropriate for the complex chemical nature of the perovskite surface. The molecule is a multi-functional passivation molecule that features electron-rich and -poor domains. In one embodiment, the molecule is phenformin hydrochloride (PhenHCl). The inventors have found that the molecule effectively passivates the perovskite grain boundaries when incorporated in the perovskite precursor solution. In addition, this molecule can also further alleviate interface defects when employed as a post-treatment molecule. Thus, in one embodiment, this molecule is used for the passivation of defects at both the grain boundaries and the surface of the perovskite material. Spectroscopic characterization shows that the PhenHCl passivation considerably suppresses the light-induced phase segregation of wide bandgap perovskites. Owing to these enhancements, PhenHCl-passivated single-junction perovskite solar cells were found to deliver about 100 mV higher average open-circuit voltage ($V_{OC}$) than the control devices. Mainly due to the $V_{OC}$ improvement, the best PhenHCl-passivated devices deliver power conversion energies (PCEs) higher than 20% with the best $V_{OC}$ values reaching 1.20 V. In addition, it was found that the PhenHCl passivation greatly improves light soaking and thermal stability of the single-junction devices. As such, the passivated devices show no $V_{OC}$ loss after more than 2700 hours of thermal stress test at 85° C. under an $N_2$ environment. The PhenHCl passivation strategy was employed for the fabrication of perovskite/silicon monolithic tandem solar cells. The passivation mainly improves the average $V_{OC}$ of the tandem devices from ~1.75 V to ~1.81 V, and consequently, the average PCE from 23.3% to 26.5%. The best tandem solar cell delivers a $V_{OC}$ of 1.84 V, a short-circuit density ($J_{SC}$) of 19.6 mA/cm², a fill factor (FF) of 76.0%, and a PCE of 27.4%, which is amongst the best PCEs reported with monolithic perovskite/silicon tandem devices.

Figure 2A:
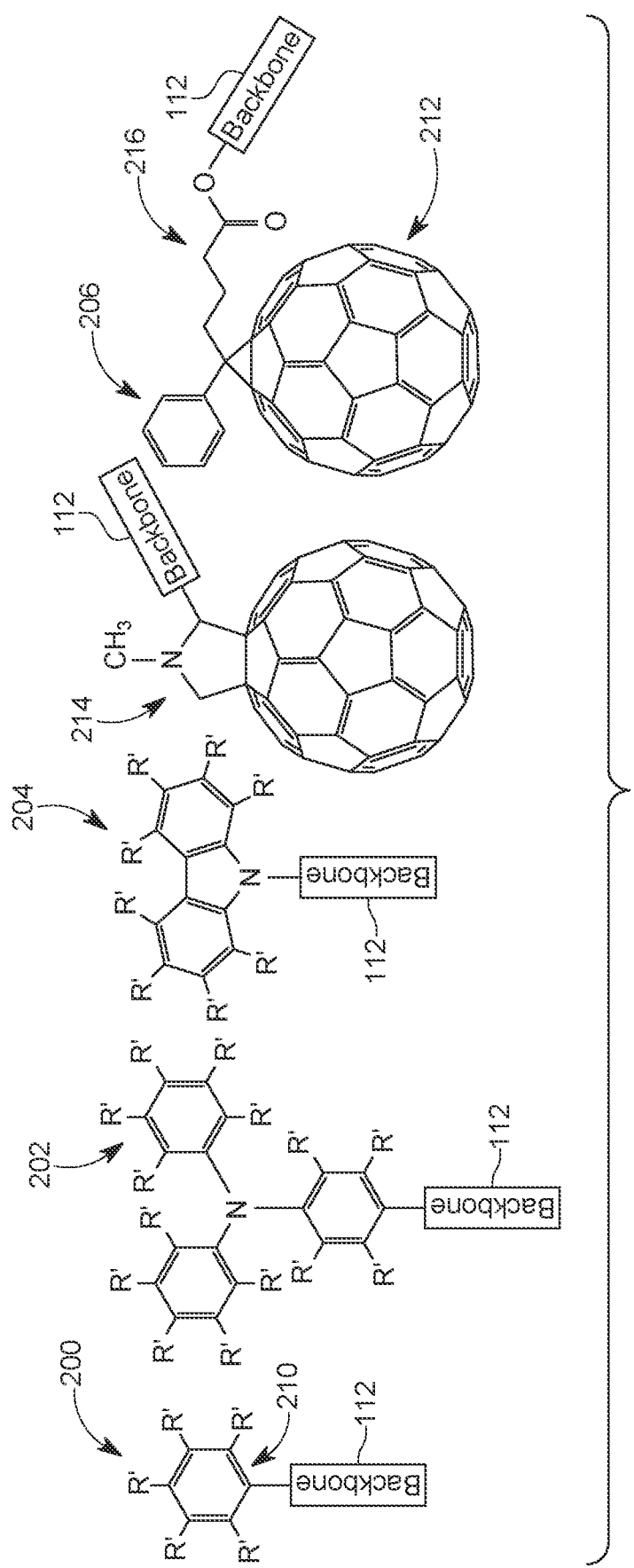
FIG. 2A illustrates the chemical composition of a tail group of the passivation molecule.

In one embodiment, a general structure of the selected passivation molecules 100 is shown in FIG. 1. The molecules 100 include a tail group 110 ($R_1$), a backbone group 112 ($R_2$), one or more pendant groups 114 ($R_3$ and $R_4$), and a head group 116 ($R_5$). The tail group 110 regulates the intermolecular interaction of the passivation molecule with an overlayer material. It can interact with interface materials in a device structure, and thus, regulate charge transfer from metal halide perovskite to the interfacial layers, or vice versa. As shown in FIG. 2A, the tail groups can be a phenyl 200, triphenylamine 202, carbazole 204 or $C_{60}$-fullerene derivatives 206. The phenyl ring 210 in these tail groups can incorporate R' side groups, wherein the R' group can be —H, —OH, —CH₃, —OCH₃, —F, —Cl, —Br, —I, —CH₂CH₃ (ethyl), n-propyl, iso-propyl, n-butyl, iso-butyl, sec-butyl, tert-butyl, or any possible combinations of these groups. Also, one or more than one carbon atoms in the phenyl rings can be replaced with an electronegative atom including oxygen (O), sulfur (S), nitrogen (N), or any possible combinations of these atoms. For the $C_{60}$-fullerene derivative 206, the C₆₀ ball 212 can be attached to the backbone group 112 through an N-methylpyrrole 214 or a phenyl-butyric acid methyl ester linker 216 as shown in FIG. 2A.

Figure 2B:
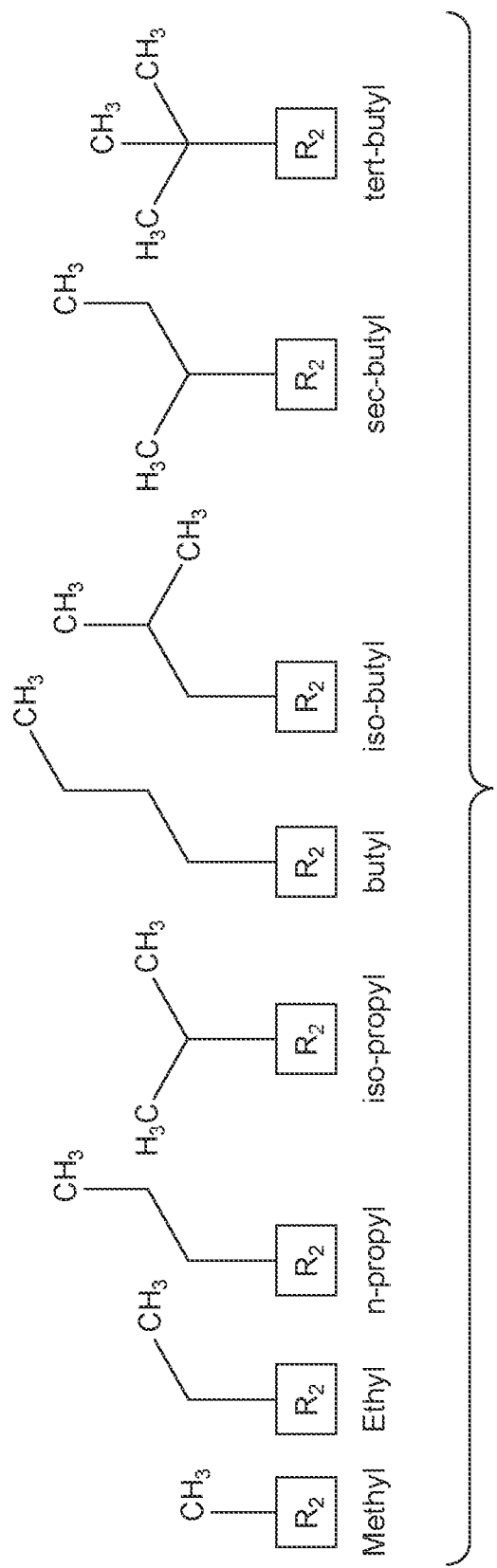
FIGS. 2B-2D illustrate the chemical composition of a pendant group of the passivation molecule.
Figure 2C:
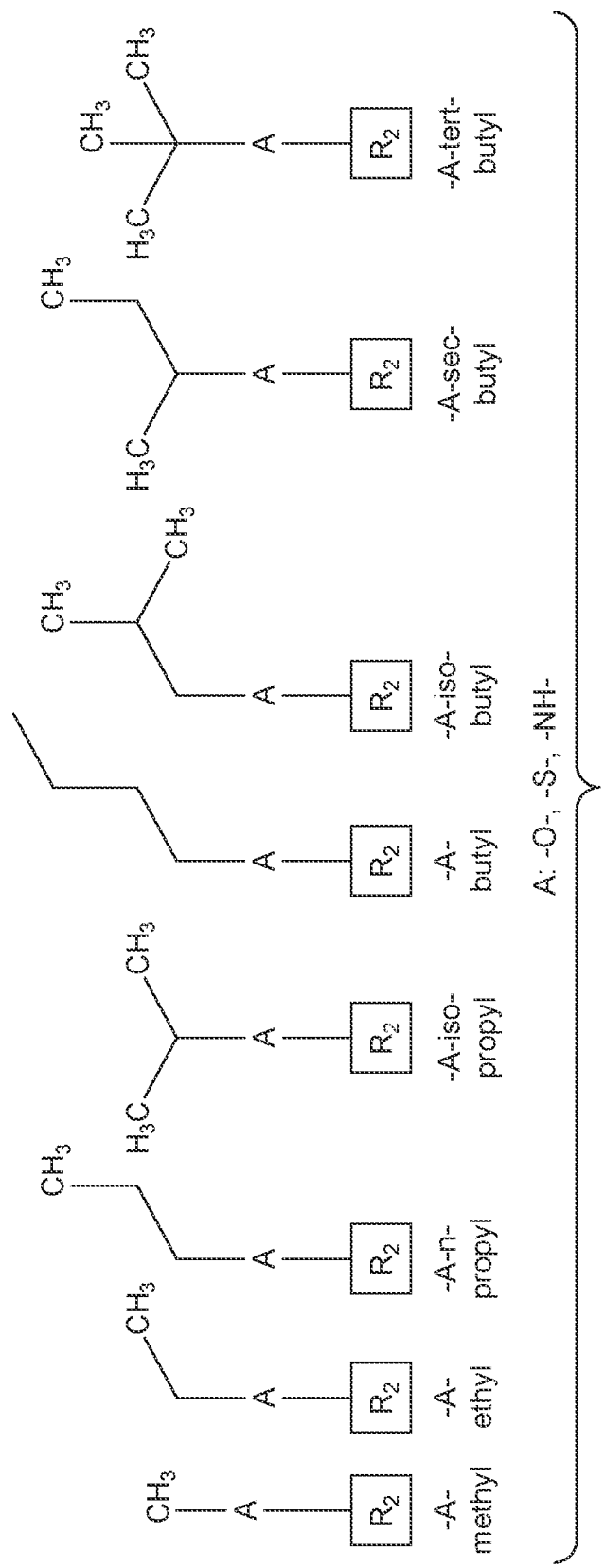
Figure 2D:
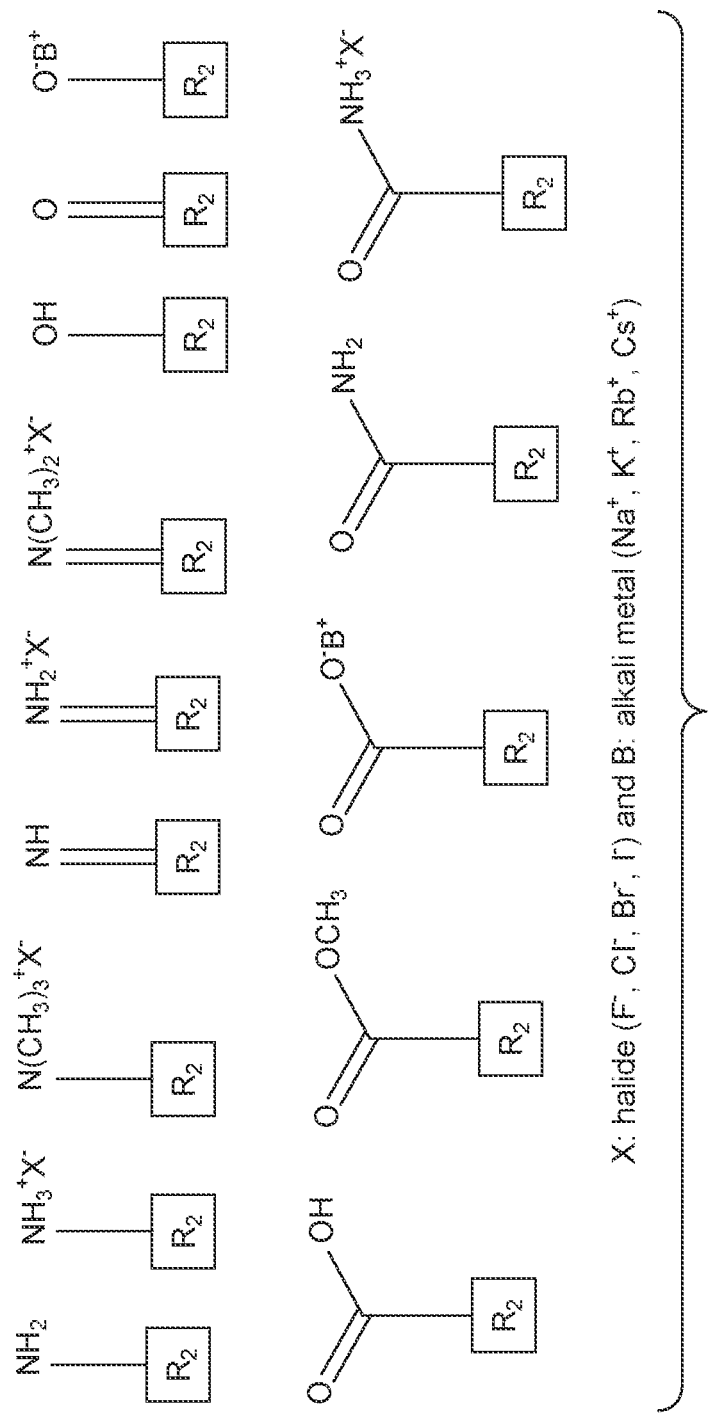

The backbone group 112 includes $R_2$ units with the number of repeating units (n) in between 1 and 20. The $R_2$ units can be —CH₂—, —CH═, —C≡, —O—, —NH₂, —NH═, —N≡, —S—, or any possible combinations of these units. The pendant $R_3$ and $R_4$ groups 114 are attached to the $R_2$ unit/s of the backbone group 112 and they can be in the form of various alkyl groups including methyl, ethyl, n-propyl, iso-propyl, butyl, iso-butyl, sec-butyl, tert-butyl, as shown in FIG. 2B. Also, these alkyl groups can be attached to the $R_2$ unit through an A group such as —O, —S, or —NH groups, as shown in FIG. 2C. Beyond alkyl derivatives, as shown in FIG. 2D, the pendant groups can also be —NH₂, —NH₃⁺X⁻, —N(CH₃)₃⁺X⁻, ═NH, ═NH₂⁺X⁻, ═N(CH₃)₂⁺X⁻, —OH, ═O, —O⁻B⁺, —COH, —COOCH₃, —COO⁻B⁺, —CONH₂, —CONH₃⁺X⁻, wherein X is a halide (F⁻, Cl⁻, Br⁻, I⁻) and B⁺ is an alkali metal (Na⁺, K⁺, Rb⁺, Cs⁺), or any combinations of these groups. Note that the passivation molecule 100 does not necessarily need to incorporate a pendant group. For instance, a passivation molecule with a linear butyl chain backbone group (—CH₂CH₂CH₂CH₂—) cannot incorporate a pendant group.

Figure 2F:
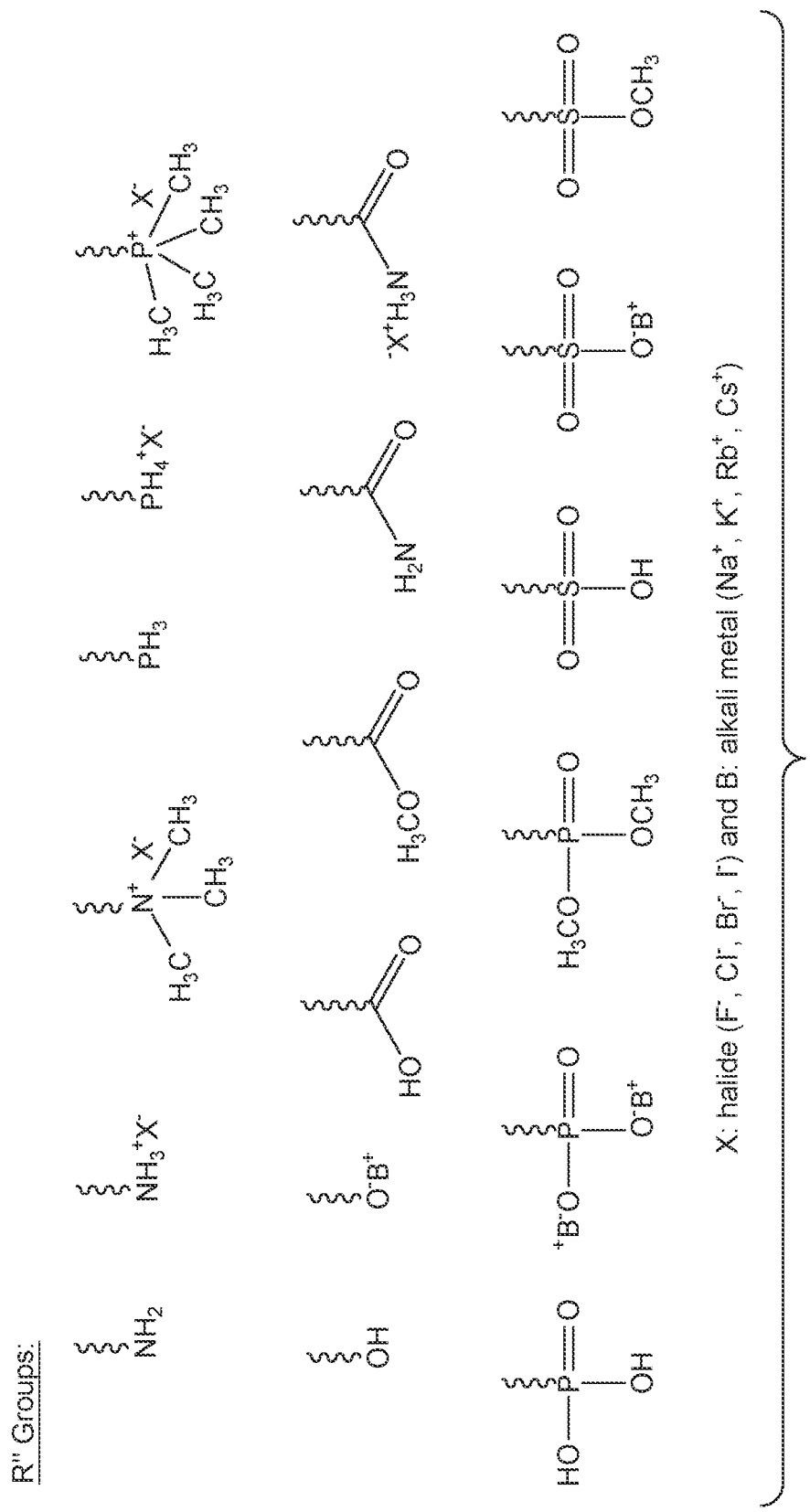

The head group 116, as shown in FIG. 2E, can include one, two or three anchoring (R") groups. The R" groups can be, as illustrated in FIG. 2F, —NH₂, —NH₃⁺X⁻, —N(CH₃)₃⁺X⁻, —PH₃, —PH₄⁺X⁻, —P(CH₃)₄⁺X⁻, —OH, —O⁻B⁺, —COH, —COOCH₃, —CONH₂, —CONH₃⁺X⁻, —PO₃H₂, —PO₃²⁻, —PO(OCH₃)₂, —SO₃H, —SO₃⁻ and —SO₂(OCH₃), or any possible combination of these groups.

Through the head and pendant groups, the molecules 100 can passivate electron-rich and/or -poor perovskite surface dangling bonds. The nature of the backbone and pendant groups generally determine the packing and intra-molecular interaction of the passivation molecules. Based on the above descriptions, a "passivation molecule" is defined herein as a molecule that has at least a head group, a tail group, and a backbone group that connects the head group to the tail group. The tail group regulates the intermolecular interaction between the passivation molecule and any adjacent layer. The tail group includes at least one phenyl ring. The head group has at least one electron rich-domain and an electron-poor domain which are separated from each other. The electron rich-domain is defined herein as having a higher valence electron concentration than the electron poor-domain.

The passivation molecules 100 can be employed to passivate at least one of metal halide perovskite surface and grain boundary as the metal halide perovskite layer is a part of an electronic device. As a specific example, a wide bandgap (~1.68 eV) $Cs_{0.15}MA_{0.15}FA_{0.70}Pb(I_{0.80}Br_{0.20})_3$ (MA: methylammonium, FA: formamidinium) metal halide perovskites' top surface and grain boundaries have been effectively passivated with phenformin hydrochloride (PhenHCl) molecules for fabrication of perovskite solar cells.

Figure 3:
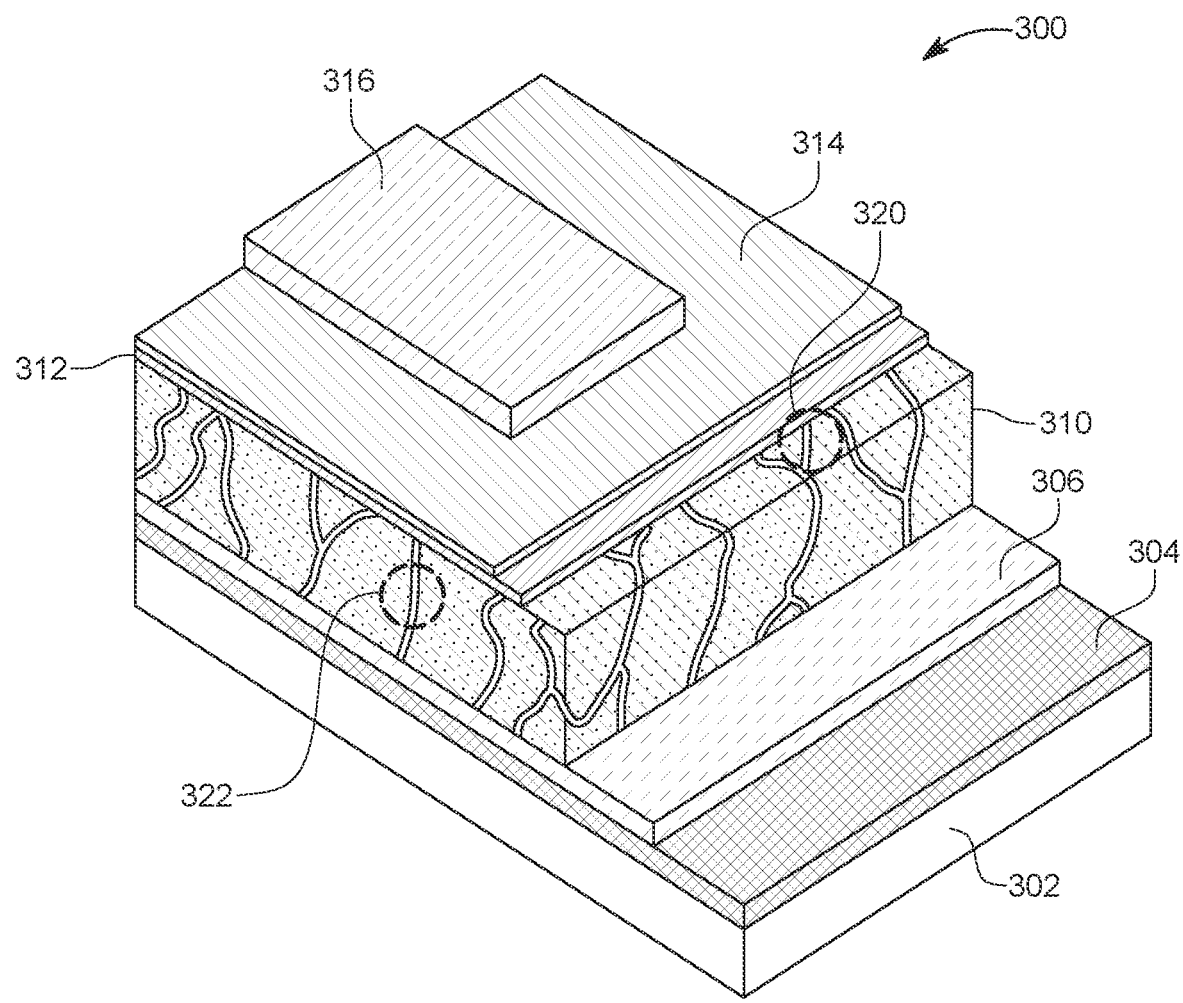
FIG. 3 illustrates a solar cell having a metal halide perovskite layer passivated with the passivation molecule of FIG. 1.

More specifically, FIG. 3 illustrates a semiconductor device, e.g., a p-i-n perovskite solar cell 300, in which the metal halide perovskite layer 310 is the active light-absorbing layer. Note that the term "semiconductor device" is used herein to mean any solar cell, light-emitting device, transistor, photo-detector, sensor, or flexible electronics that include at least one semiconductor device. The solar cell 300 has a substrate 302, which can be made of glass, a first electrode layer 304, which can be made of ITO, and which is located over the substrate 302, a seed layer (not shown), a hole selective layer 306, which can be made of poly (triaryl)amine (PTAA), and which is located over the first electrode 304, the metal halide perovskite layer 310, an electron selective layer 312, which can be made of a $C_{60}$ layer, and which is formed over the metal halide perovskite layer 310, a buffer layer 314, which can be made of bathocuproine (BCP), and which is located over the electron selective layer 312, and a second electrode 316, which can be made of Ag, and which is located over the buffer layer 314. In one application, it is possible to treat the surface of the hole selective layer 306 with cesium iodide (CsI) solution to form artificial nucleation sites, i.e., the seed layer, and consequently, improve the wettability of the layer 306's surface.

Figure 4A:
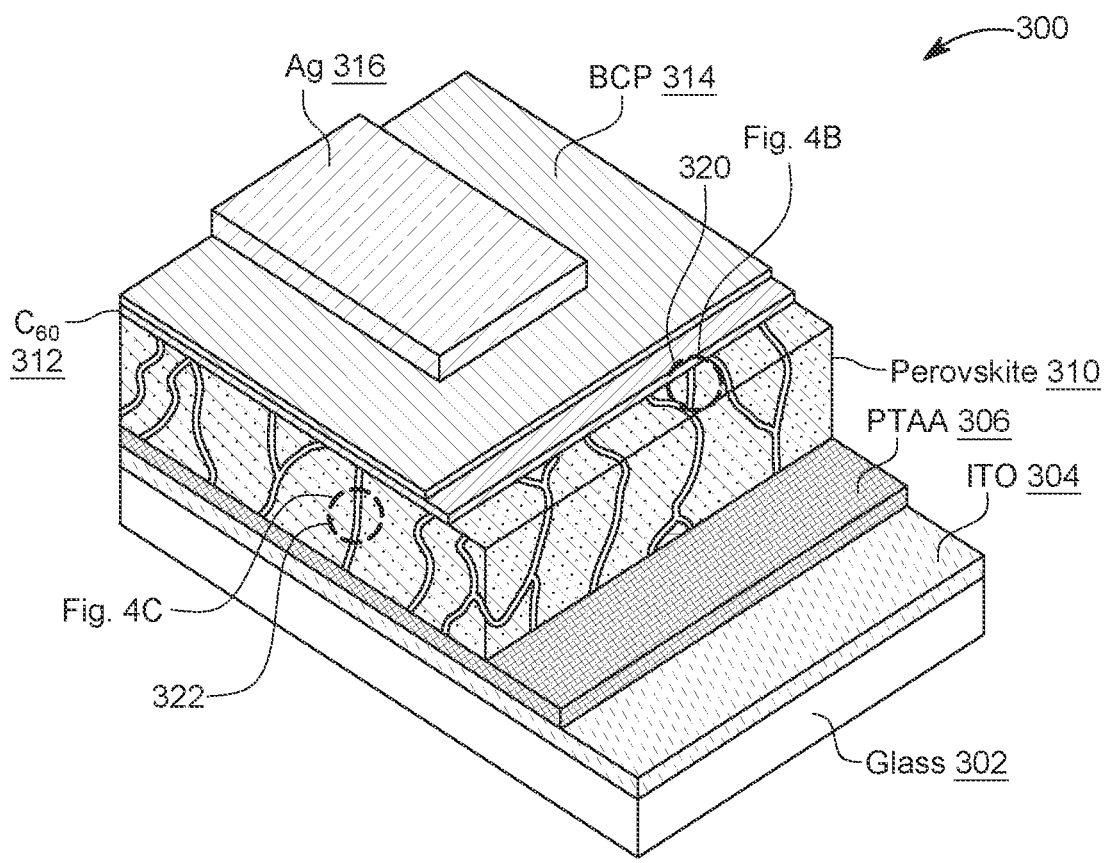
FIGS. 4A to 4C schematically illustrate the top surface passivation and the inter-grain passivation of the metal halide perovskite layer for the solar cell of FIG. 3.
Figure 4B:
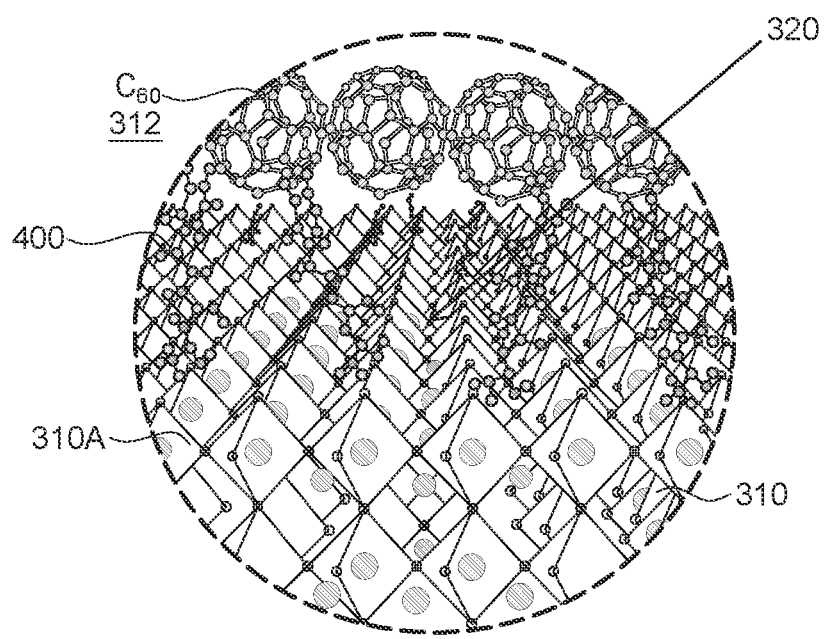
Figure 4C:
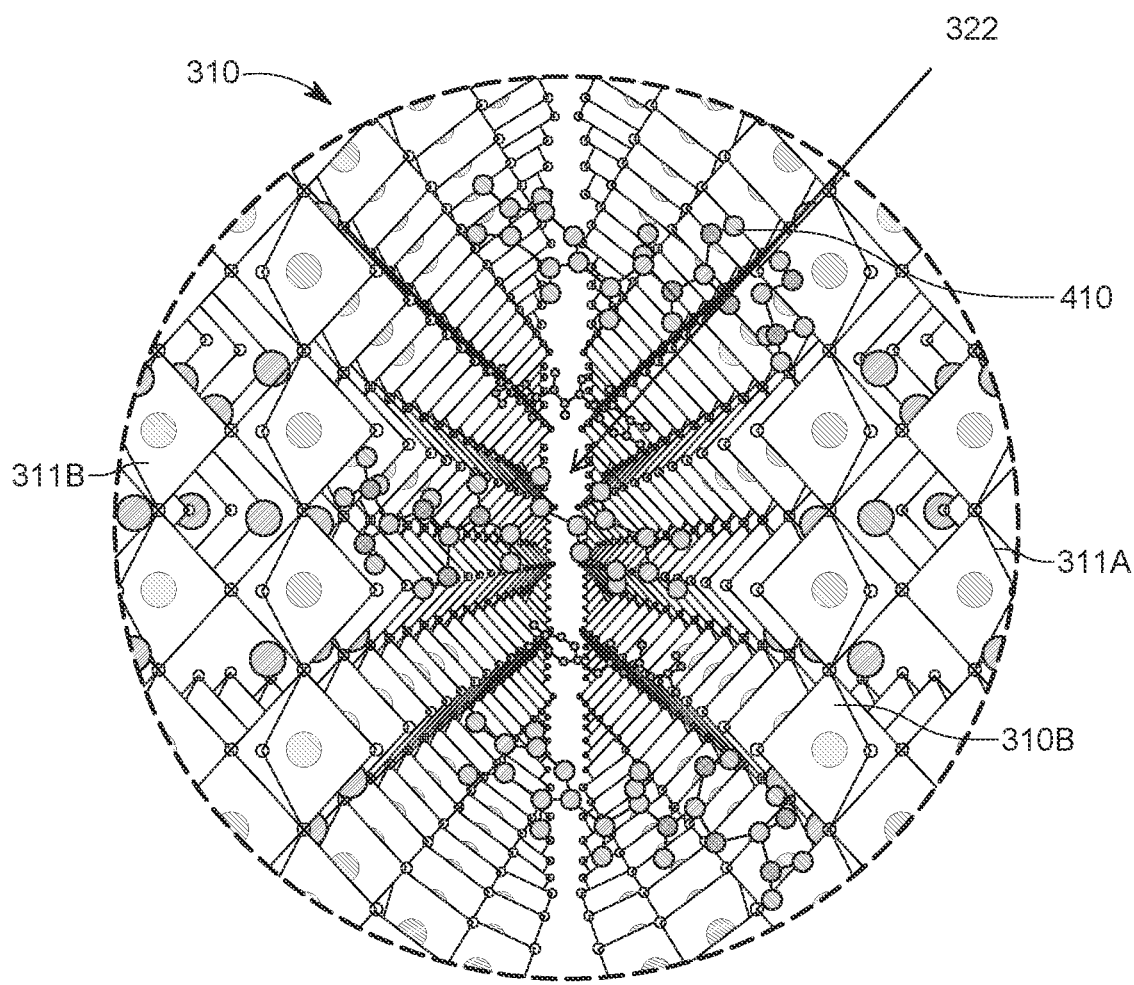

Top surface defects 320 and/or grain defects 322 are typically present in any electronic device that uses metal halide perovskite materials, as illustrated in FIGS. 3 to 4C. While the top surface defects 320 appear in an external surface of the halide perovskite layer, the grain defects 322 appear between grain regions of the metal halide perovskite layer, i.e., within the material of the layer. One or both of these defects may be corrected by using a PhenHCl molecule passivation process. For example, as illustrated in FIG. 4B, the top surface defects 320 appear at an interface 310A (or top surface 310A of the layer 310) between the metal halide perovskite layer 310 and the buffer layer 312 and the grain defects 322 appear within the metal halide perovskite layer 310, at the interface 310B between two different but adjacent grains 311A and 311B, as shown in FIG. 4C.

Figure 5:
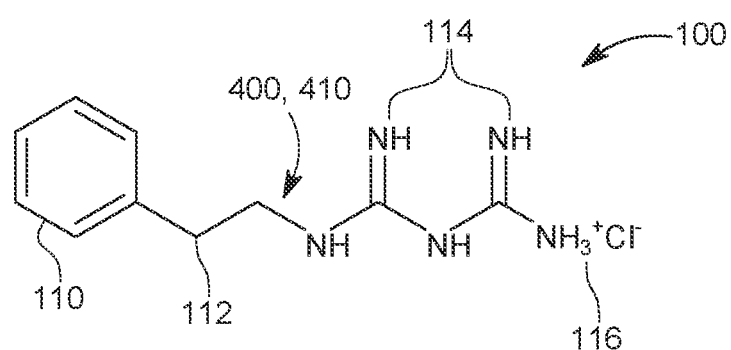
FIG. 5 schematically illustrates the chemical composition of a PhenHCl molecule used as a passivation molecule.

The top surface defects 320 shown in FIG. 4B can be passivated with a top-surface passivation (TSP) technique, that places a layer of PhenHCl material 400 (which includes the passivation molecule 100, in this case, the PhenHCl molecule) between the external surface 310A of the metal halide perovskite layer 310 and the buffer layer 312, while the grain defects 322 are passivated with a grain-boundary passivation (GBP) technique, that places a portion 410 of the PhenHCl material between the grains 311A and 311, as shown in FIG. 4C. The structure of the PhenHCl molecules of the materials 400 and 410 is shown in FIG. 5. The molecule 100 includes a phenyl tail group 110, two =NH pendant groups 114, and an $NH_3^+Cl^-$ head group 116 attached to a —$CH_2$—$CH_2$—NH—C—NH—C— backbone 112. Although the materials 400 and 410 have the same chemical composition, they are obtained from different processes, with different concentrations, as discussed later. Even more, the physical shapes of these two materials are different, the material 400 being a layer while the material 410 having a shape that fits in a defect between two or more grains of the metal halide perovskite.

A method for forming the device 300 and passivating the top surface and/or the grain defects is now discussed. The inverted (p-i-n) device 300 shown in FIG. 4A includes ITO-PTAA-$Cs_{0.15}MA_{0.15}FA_{0.70}Pb(I_{0.80}Br_{0.20})_3$-$C_{60}$-BCP-Ag in this order. The device 300 can be prepared using the following procedure. ITO glass substrates 302/304 were cleaned by sonication successively in detergent, deionized water, acetone, and isopropanol. The sonication time was 15 minutes for each cleaning. They were then dried with $N_2$ flow and transferred to a glovebox filled with $N_2$. The hole (or electron) transporting layer 306, PTAA (2 mg/ml in CB), with a thickness of ~15 nm was spin-coated on top of the ITO substrates 302/304 at 6000 rpm for 20 s and subsequently annealed at 100° C. for 10 min. Prior to coating the perovskite layer 310, CsI (1.5 mg/ml in DMF) was spin-coated onto the PTAA layer 306 at 4000 rpm for 40 s. Subsequent annealing of the film at 100° C. for 5 min results in formation of CsI islands on the PTAA layer 306, which act as artificial nucleation sites. To coat the perovskite layer 310, the perovskite precursor solutions were prepared by dissolving CsI, formamidinium iodide (FAI), methylammonium bromide (MABr), $PbI_2$ and $PbBr_2$ salts in co-solvent of dimethylformamide (DMF)/dimethyl sulfoxide (DMSO) (4/1:v/v) to obtain 1.25 M of $Cs_{0.15}MA_{0.15}FA_{0.70}Pb$ $(I_{0.80}Br_{0.20})_3$. The perovskite solutions were then coated onto the PTAA layer 306 by using a consecutive two-step spin-coating process consisting of 2 k rpm for 10 s and 5 k rpm for 30 s. Next, 300 µl of ethyl acetate (EtAc) was dropped at the $10^{th}$ second of the second step. The films were then annealed at 100° C. for 30 min.

For the grain boundary passivation process, certain concentrations (discussed later) of PhenHCl were added to the precursor solutions. On the other hand, to passivate the top surface of the perovskite layer, certain concentrations (also discussed later) of PhenHCl dissolved in isopropanol (IPA) were spin-coated 4000 rpm for 40 s followed by an annealing step. The devices were completed by thermal deposition of the $C_{60}$ layer 312 (e.g., 40 nm thick), BCP layer 314 (e.g., 8 nm thick), and the Ag or Cu (100 nm thick) electrode 316 at a vacuum of less than $3 \times 10^{-6}$ torr. The PhenHCl concentrations for the various defect passivation are now discussed.

The wide-bandgap perovskite $Cs_{0.15}MA_{0.15}FA_{0.70}Pb$ $(I_{0.80}Br_{0.20})_3$ with a bandgap of ~1.68 eV is chosen in one embodiment as the metal halide perovskite because it provides an ideal bandgap for the fabrication of perovskite/silicon tandem solar cells. However, other metal halide perovskite materials may be selected. To passivate the perovskite grain interface/boundaries 310B in FIG. 4C, specific concentrations of the PhenHCl are added into the perovskite precursor solutions. It was found that the average $V_{OC}$ of the tested devices improves from 1.08 V to 1.16 V when the concentration of the PhenHCl in the perovskite solution reaches to 1 mg/ml. On the other hand, the optimum PhenHCl concentration for the GBP technique has been determined to be 0.25 mg/ml, resulting in an average $V_{OC}$ of 1.15 V. This is mainly due to a drop in the fill factor FF of the devices when the PhenHCl concentrations exceed 0.50 mg/ml.

For the TSP case, specific concentrations of PhenHCl, dissolved in isopropanol, are spin-coated onto the perovskite thin film 310 to passivate its top surface (i.e., the perovskite-$C_{60}$ interface shown in FIG. 4B). Although the $V_{OC}$ of the tested devices shows an improving trend with increasing the PhenHCl concentration, the FF values start to drop for the concentrations higher than 0.5 mg/ml. Consequently, the inventors have found that an amount of 0.75 mg/ml PhenHCl is the best concentration for the TSP case when the perovskite film is annealed at 100° C. for 5 minutes. Further tests were carried out to finely tune the annealing temperature and duration of the TSP process. In this regard, annealing of the PhenHCl coated perovskite layer at 80° C. for 5 minutes delivers the best performance.

Figure 6A:
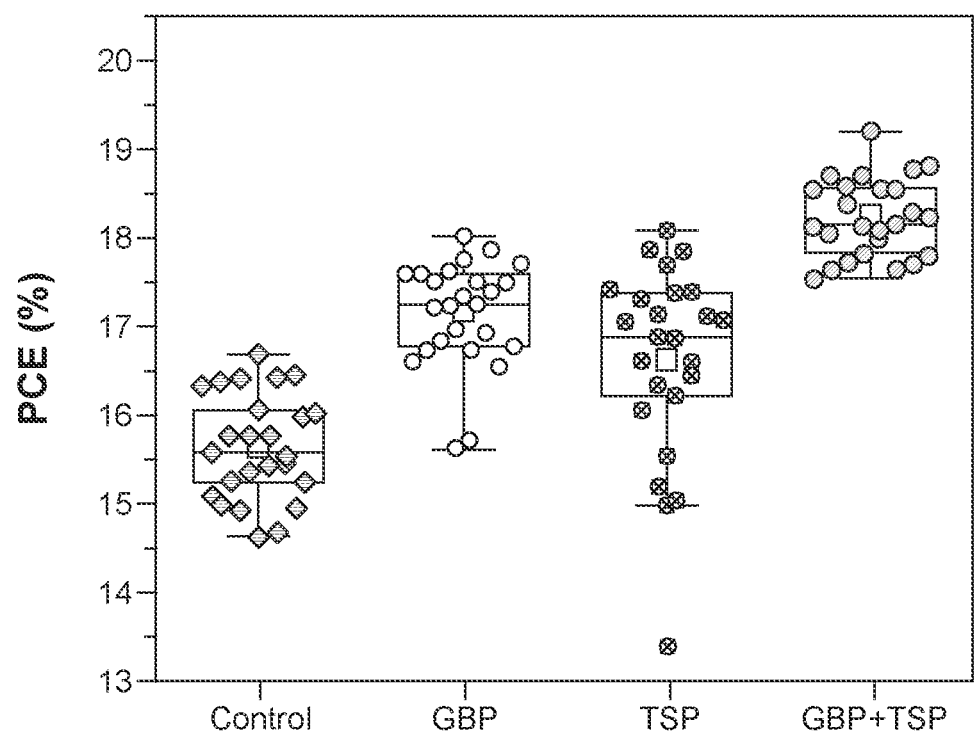
FIGS. 6A to 6D illustrate the power conversion energy PCE, average open-circuit voltage $V_{OC}$, short-circuit density $J_{SC}$, and fill factor FF of a control solar cell versus the same solar cell having the metal halide perovskite layer inter-grain passivated, top surface passivated, and inter-grain and top surface passivated.
Figure 6B:
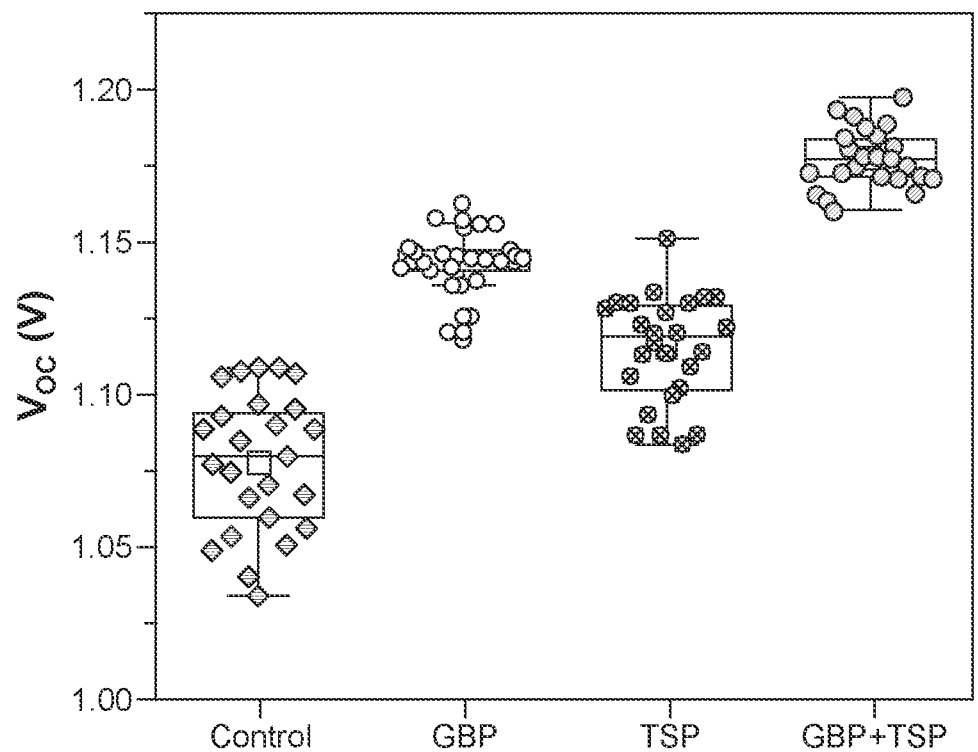
Figure 6C:
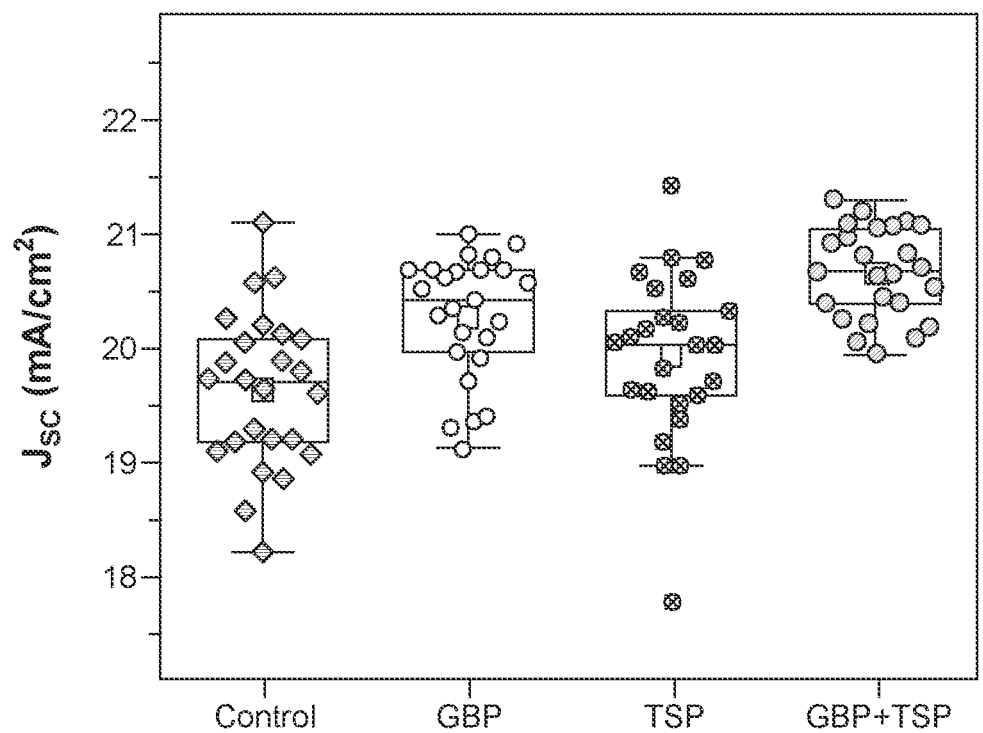
Figure 6D:
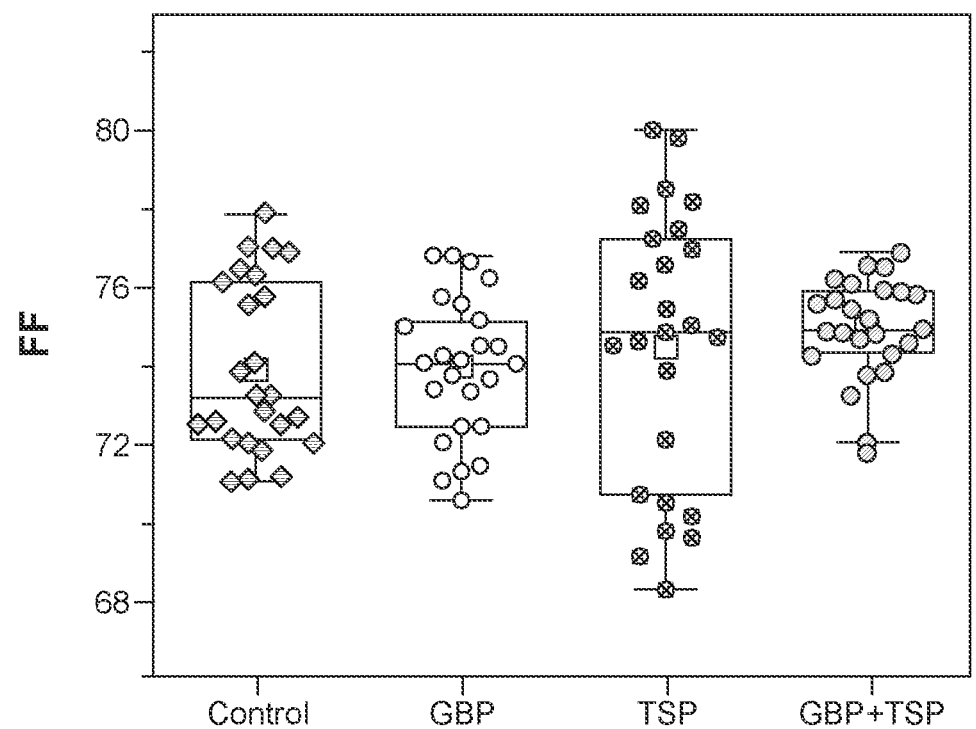

FIGS. 6A to 6C summarize the figures of merit of perovskite solar cells' performance fabricated with grain boundary passivation (GBP), top surface passivation (TSP), and a combination of both (GBP+TSP) in comparison to the control devices. Notably, all passivation routes improve the open-circuit voltage $V_{OC}$ without resulting in a drop in the fill factor FF and short-circuit current density $J_{SC}$ values. The combination of GBP+TSP works better, and thus, it provides the highest efficiencies, mainly due to the significant improvement in the average $V_{OC}$ by ~100 mV. The considerable improvement in the $V_{OC}$ values highlights that the PhenHCl is highly effective in passivation of perovskite defects, originating from surface dangling bonds, which act as trap centers. Thus, PhenHCl passivation minimizes trap-assisted recombination losses and thus considerably improves the voltage output of the devices.

The external quantum efficiency (EQE) spectra (not shown) of the control device does not show a considerable change upon the passivation. As such, the control and passivated perovskites' have the same bandgaps of ~1.68 eV, extracted from the first derivative of the EQE curves (dEQE/dλ). On the other hand, the passivation treatments cause an increase in the average series resistance ($R_s$) from 3.5 Ω·cm² to 3.8-4.5 Ω·cm². The increase in $R_S$ is counter-balanced by an enhancement in the average shunt resistance ($R_{sh}$) from 2.5 kΩ·cm² to 5.0-6.1 kΩ·cm². Consequently, the passivation procedures do not have a considerable effect on the FF, contrasting with the $V_{OC}$. The average $V_{OC}$ of the control devices improves from 1.08 V to 1.14 V, 1.11 V, and 1.18 V for the GBP, TSP, and GBP+TSP, respectively. The GBP+TSP provides the highest efficiencies, mainly due to the significant improvement in the average $V_{OC}$ by ~100 mV. A comparison of the J-V curves of the best-performing control and GBP+TSP devices (not shown) indicates that the best performing control device has a PCE of 16.7% with a $V_{OC}$ of 1.08 V, an FF of 73.3 and a $J_{SC}$ of 21.1 mA/cm². The $V_{OC}$ of the GBP+TSP device shows an improvement of 100 mV reaching 1.18 V. Mainly due to the $V_{OC}$ enhancement, the best GBP+TSP solar cells deliver a PCE of 19.2%. Also, when a polydimethylsiloxane (PDSM) anti-reflective coating (ARC) is applied on the glass side, the $J_{SC}$ improves by about 1 mA/cm² due to a reduced reflectance, resulting in a top PCE of 20.3%. This is among the highest efficiencies reported in the literature for such wide bandgap perovskites, particularly optimized for fabrication of perovskite/silicon tandem solar cells [5].

Figure 7:
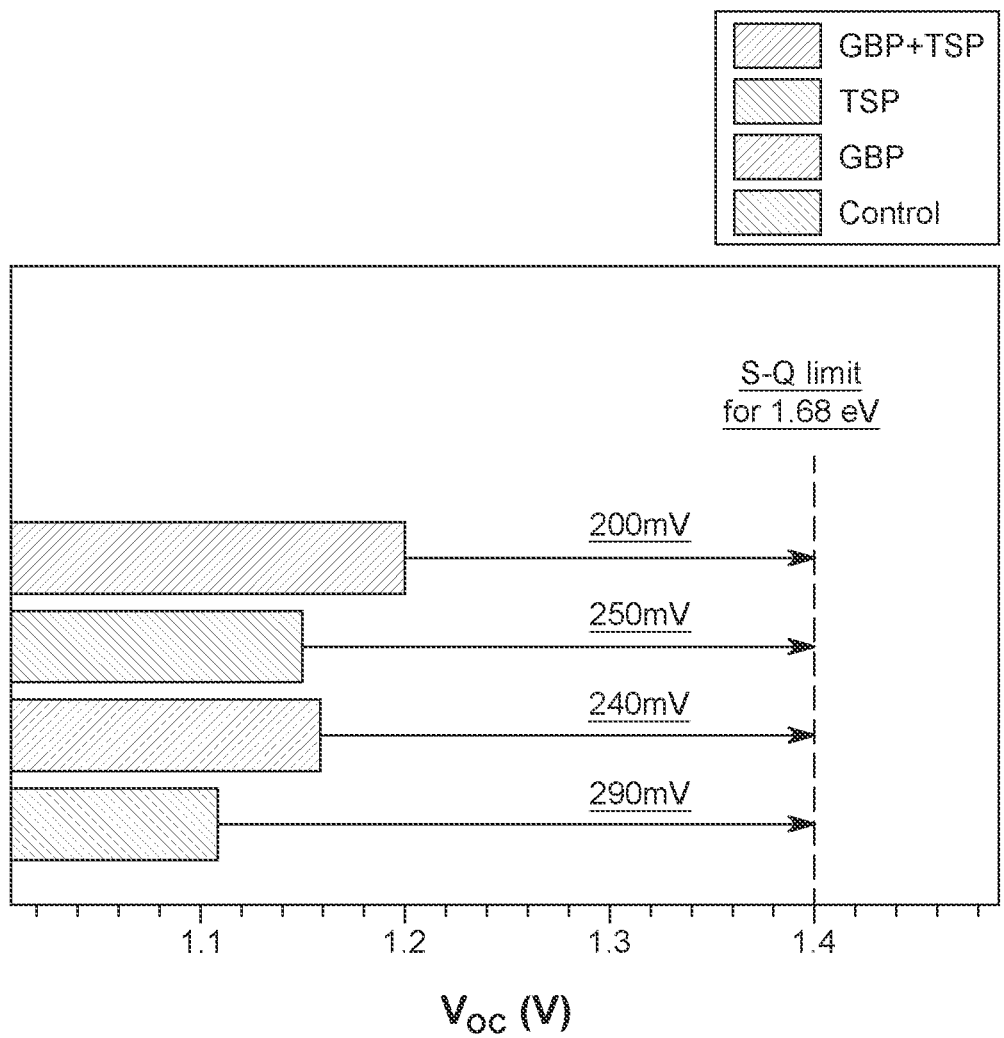
FIG. 7 illustrates the maximum achievable $V_{OC}$ with the different passivation strategies and $V_{OC}$ losses of each condition with respect to the S-Q limit of a single-junction solar cell (1.40 V) with a bandgap of 1.68 eV at 25° C.

FIG. 7 compares the minimum achievable $V_{OC}$ deficits obtained for each of the conditions with respect to the S-Q limit for single-junction solar cells at 25° C. As shown, the GBP+TSP of the perovskite with PhenHCl molecule can decrease the deficit from 290 mV to 200 mV. This loss can be further minimized with better interlayer materials having minimum band offsets with respect to perovskite absorbers.

Further, the hysteresis of the devices is investigated by analyzing their forward (−0.1 V →1.2 V) and reverse (1.2 V →−0.1 V) scan J-V curves (not shown). The control devices have a low average hysteresis index (defined as 1−($PCE_{forward}$/$PCE_{reverse}$)) of ~3.5×10$^{-2}$. The passivation procedures reduce the average hysteresis index even further to ~1.5×10$^{-2}$, ~1.9×10$^{-2}$, and ~1.8×10$^{-2}$ for the GBP, TSP, and GBP+TSP cases, respectively. Since ion migration has been proposed as a cause of photovoltaic J-V hysteresis in hybrid PSCs, reduction of the hysteresis indices can be correlated to the suppressed ion migration upon the passivation. In this respect, PhenHCl can effectively passivate the dangling perovskite surface bonds, and thereby, reduce surface triggered ion migration.

To verify the potency of the PhenHCl passivation, the inventors comparatively studied the performance of the inverted PSCs passivated with PEAI, which is amongst the most commonly used passivation agent in the literature. For this study, the GBP+TSP combination was used for the device 300. The compared devices were fabricated and measured under identical conditions. The PSCs passivated with PEAI have slightly higher FF values; average FF values are 75.7 and 74.5 respectively for the PEAI and PhenHCl passivation cases. On the other hand, the PhenHCl passivation delivers a significantly higher $V_{OC}$. The devices passivated with PhenHCl have an average $V_{OC}$ of 1.18 V, whereas this value is 1.14 V for the PEAI case. Similarly, the best $V_{OC}$ values are 1.20 V and 1.17 V, respectively. These results show that the PhenHCl passivation produces about 30-40 mV higher $V_{OC}$ compared to the PEAI passivation. This can be explained by the multi-functional groups existing on the PhenHCl molecule, particularly electron-rich amine and imine nitrogens, which PEAI does not possess.

Figure 8A:
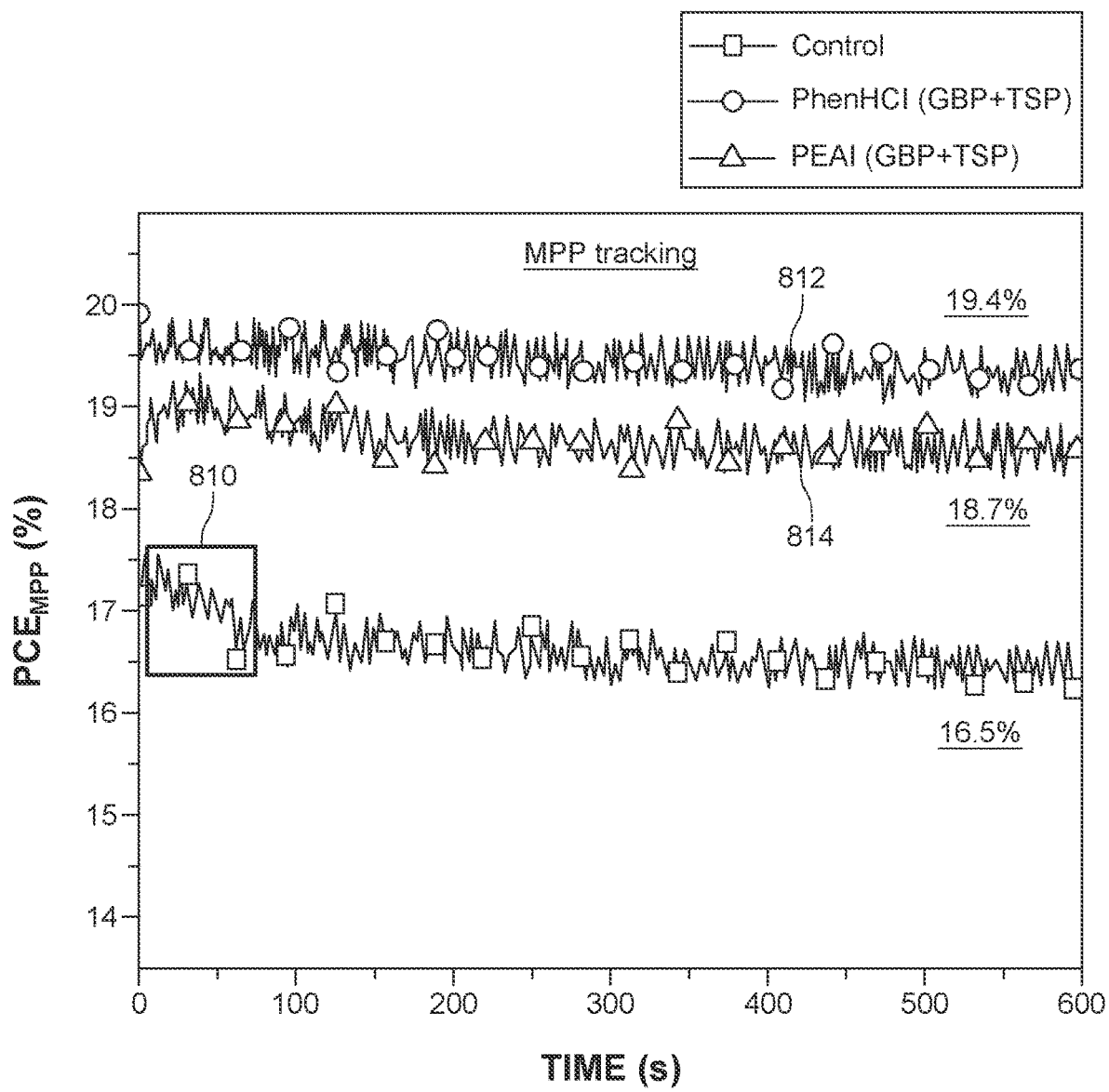
FIG. 8A illustrates the maximum power point tracking.

The impact of both the PhenHCl and PEAI passivation on the device stability was also investigated. FIG. 8A shows the evolution of the maximum power point (MPP) tracking over 600 seconds. It is noted that the control device's PCE rapidly drops by about 0.6% absolute (from 17.3% to 16.7%, highlighted with the square 810) during the first minute of the MPP tracking under light illumination. Contrastingly, the passivated devices exhibit more stable power output (see curves 812 and 814). The initial PCE drop of the control devices can be attributed to photo-induced phase segregation behavior of mixed-halide perovskites.

Figure 8B:
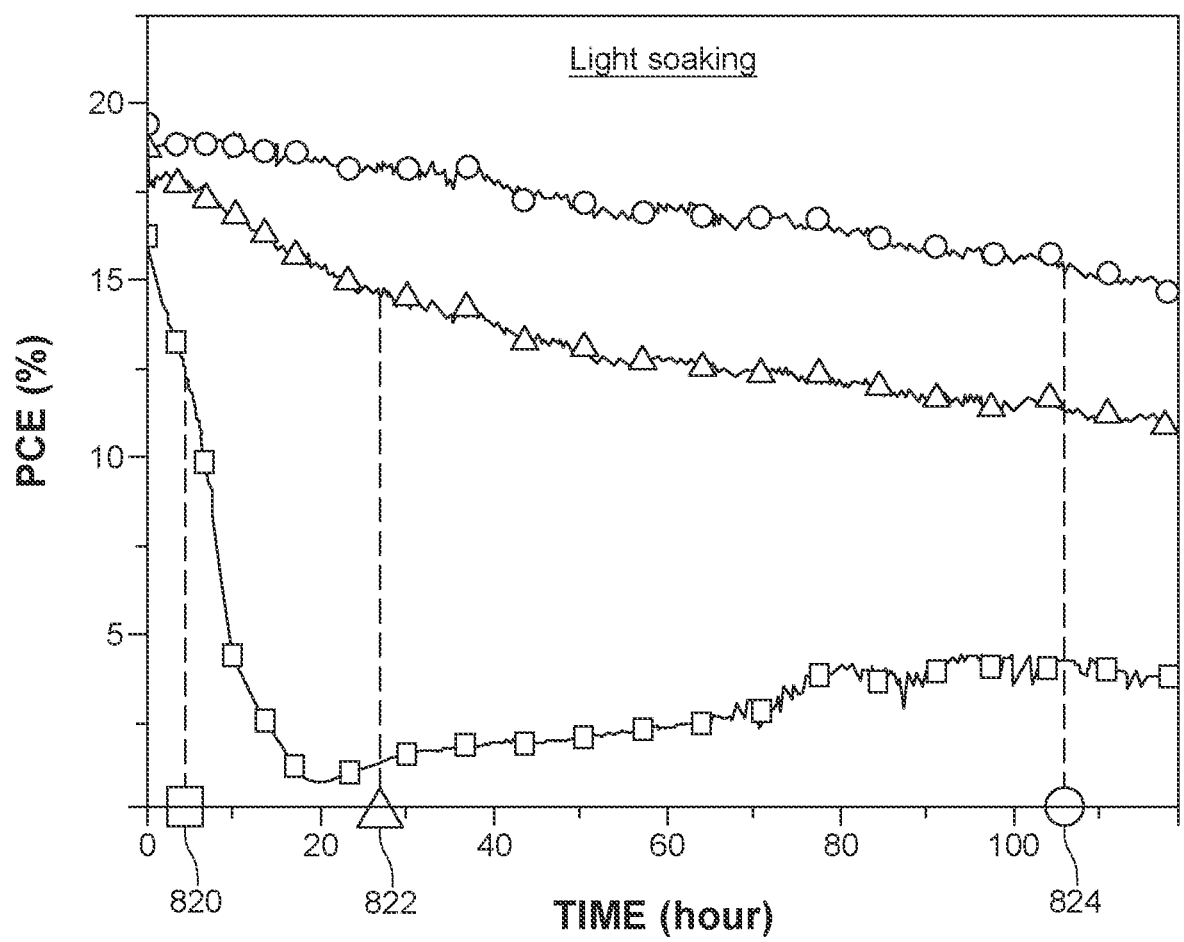
FIG. 8B illustrates the light soaking stability.
Figure 8C:
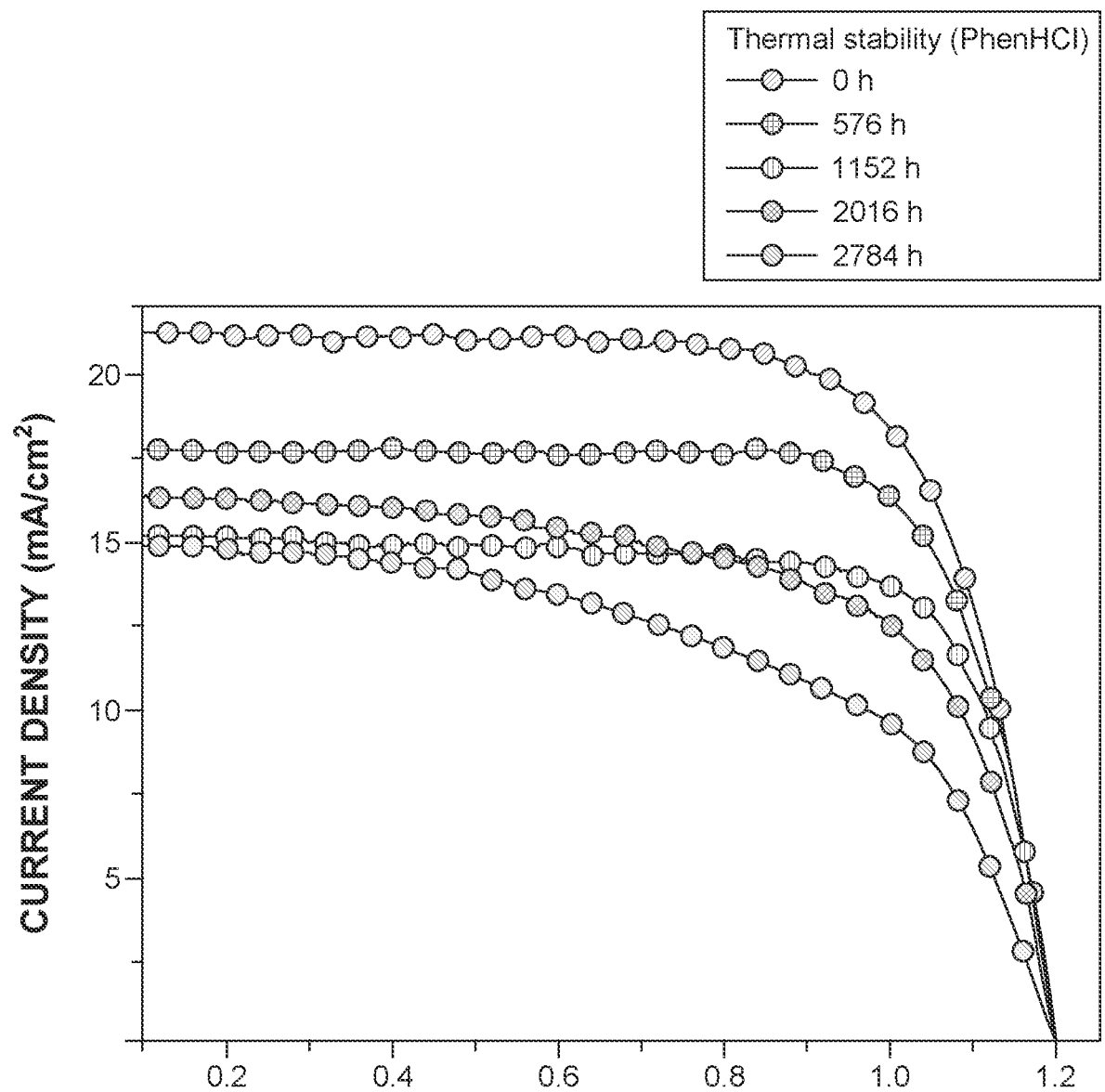
FIG. 8C illustrates the thermal stability of control, PEAI- and PhenHCl-passivated devices.

To investigate the effect of the possible halide segregation due to photoexcitation on device performance, the inventors tested the light stability of the devices under continuous light soaking without encapsulation. As shown in FIG. 8B, the control device degrades very fast by losing 20% of its initial PCE in less than 5 hours (see square 820). The PEAI-passivated device exhibits an improved photo-stability in comparison to the control device as it takes ~27 h (see triangle 822) to lose 20% of its initial PCE. On the other hand, the PhenHCl-passivated device exhibits the best photo-stability as it retains 80% of its post-burn-in PCE for ~106 h (see circle 824) of operation. The thermal stability of the devices were also tested by heating the devices at 85° C. without encapsulation in an $N_2$-filled glove box. For this test, the average PCE values of the four devices for each condition were recorded every ~8 days (~192 h). In line with the light soaking tests, the PhenHCl-passivated devices exhibited outstanding thermal stabilities by retaining 80% of their average PCE after more than 1000 hours, whereas, the PEAI-passivated and control devices retain 80% of their average PCE only for ~240 and ~50 hours, respectively. FIG. 8C shows the J-V curves of a PhenHCl-passivated PSC taken at different time durations under the thermal stability test at 85° C. As shown, the PCE loss is mainly due to the drop in the $J_{SC}$, on the other hand, there is no loss in the $V_{OC}$ after more than ~2700 h of the thermal stability test. This highlights the outstanding capability of the PhenHCl passivation as the zero loss in the $V_{OC}$ indicates that the passivated surfaces are still intact.

Figure 9:
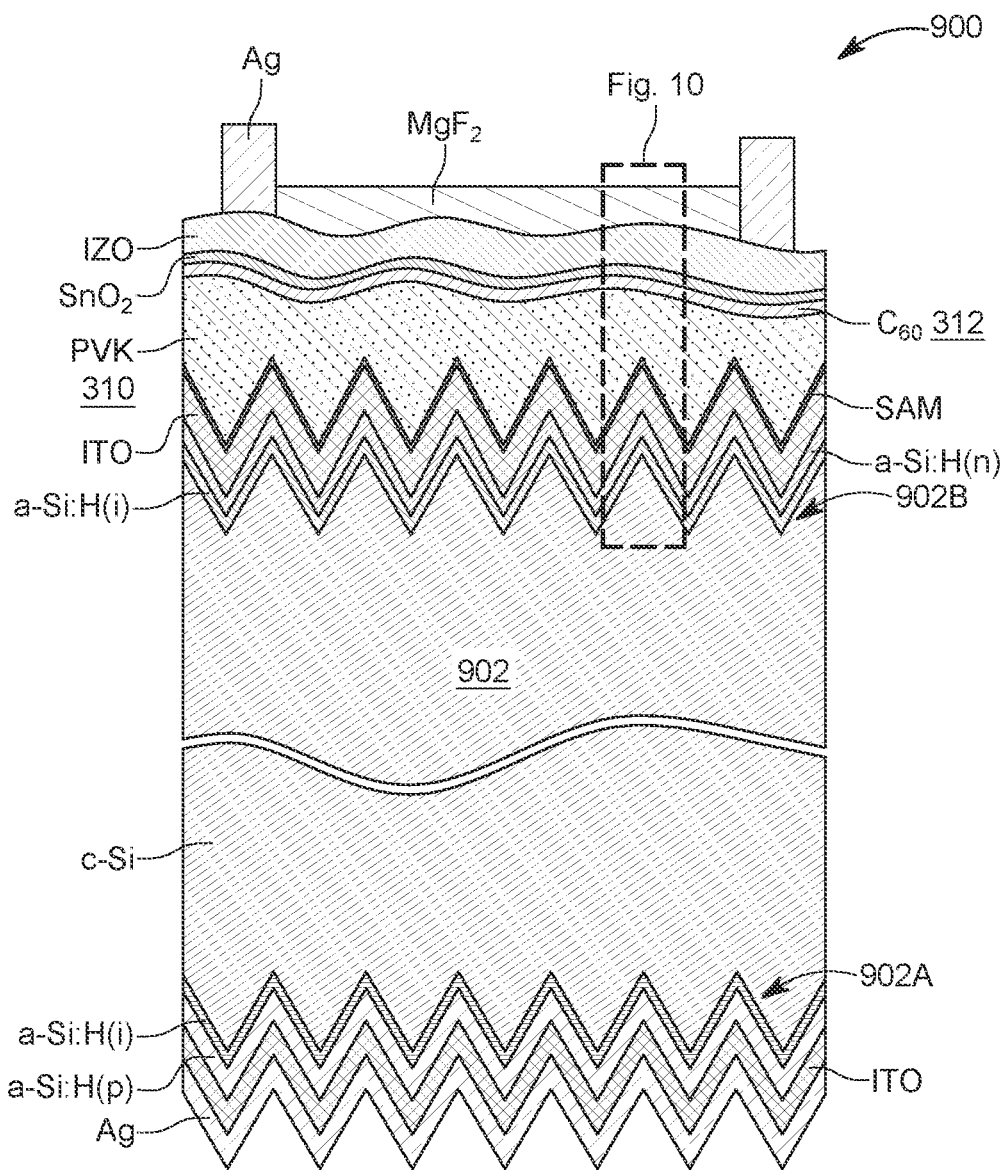
Figure 10:
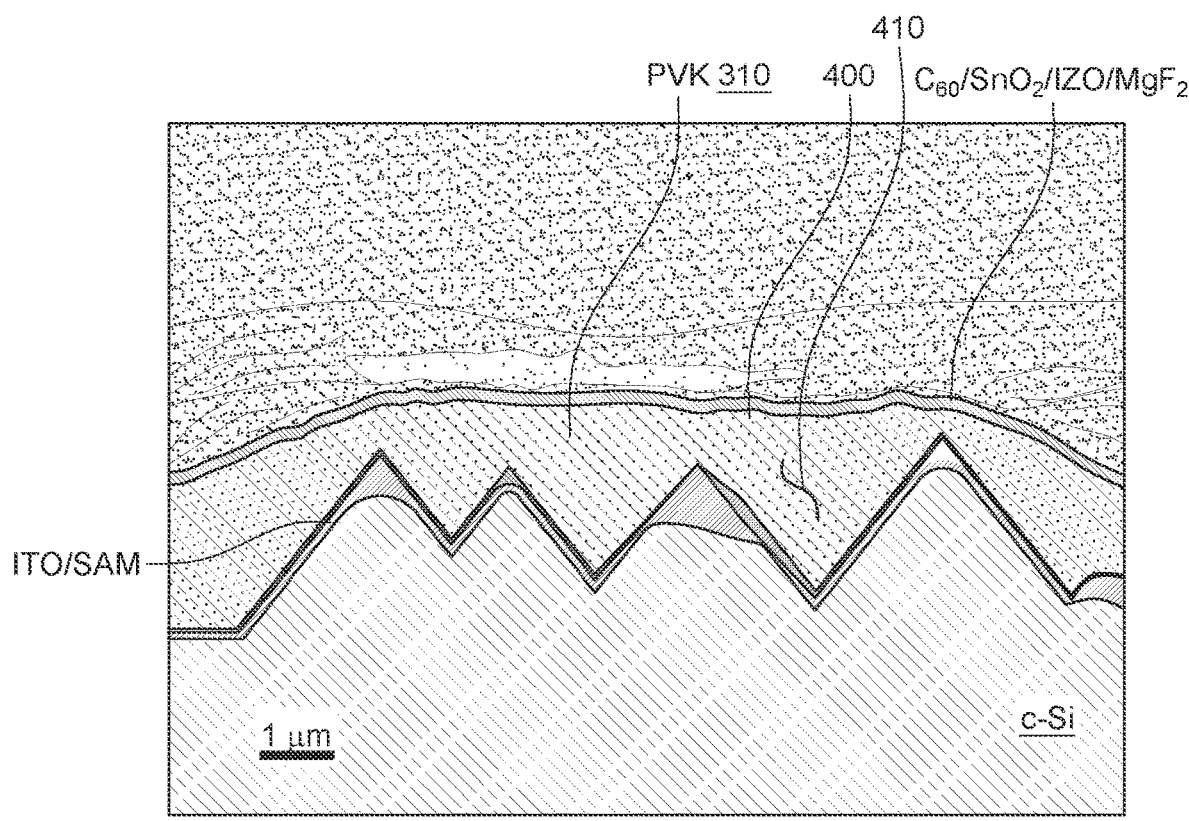
FIG. 10 illustrates the electron microscopy image of this device.

In another embodiment, the metal halide perovskite was used in a textured silicon tandem solar cell 900, as shown in FIG. 9, and the grain and/or surface PhenHCl passivation was used for this device. More specifically, the textured silicon tandem solar cell 900 has a substrate 902 (made of Si) which is textured to have the top and bottom surfaces 902A and 902B textured, i.e., not flat. The textured surfaces can have ups and downs, being characterized by a zig-zag pattern. Other patterns may be used to obtain the textured surfaces. Various other layers (indicated in the figure) are present in the device. The layer of interest is the metal halide perovskite layer 310, with the surface passivation material 400 and the inter-grain passivation material 410 as shown in FIG. 10. While both materials have been used for the device shown in FIG. 10, it is possible that only one of them is used as previously discussed. Note that in this embodiment, the metal halide perovskite layer 310 has a surface that is also textured, i.e., it is not flat, but follows the profile of one of the surfaces 902A or 902B. However, the opposite surface of the metal halide perovskite layer 310 can be flat, i.e., it does not have to be textured. Various other layers are shown in FIG. 9, e.g., electrodes, buffer layers, etc.

The 1.68 eV wide-bandgap $Cs_{0.15}MA_{0.15}FA_{0.70}Pb(I_{0.80}Br_{0.20})_3$ perovskite layer 310 is integrated on top of the silicon heterojunction (SHJ) bottom cell for fabrication of perovskite/textured silicon tandem solar cell 900. From the study of the control and PhenHCl-passivated (GBP+TSP) tandem solar cells, in line with the single-junction device results noted above, the PhenHCl passivation particularly improves the average $V_{OC}$ of the tandem devices by ~60 mV in addition to an average ~3% improvement in the FF. The best $V_{OC}$ of the passivated devices reaches 1.84 V. The enhancements in $V_{OC}$ and FF can be attributed to the reduced recombination losses at the perovskite grain boundaries and top surface after passivating the dangling perovskite surface bonds with multi-functional PhenHCl molecule. Consequently, the passivation enhances the average PCE of the tandem devices from 23.3% to 26.5%. The inventors found that the passivated devices deliver the highest PCE of 27.4%, whereas, the best PCE of the control device remains at 25.4% (reverse scan). The EQE of the best PhenHCl-passivated tandem device shows that the sub-cells are current-matched at 19.3 mA/cm$^2$, being very close to the $J_{SC}$ of 19.6 mA/cm$^2$ measured from the J-V curve. MPP tracking of the passivated tandem device over 10 minutes indicates that the device has a stable power output, stabilized at 27.4%.

Figure 11A:
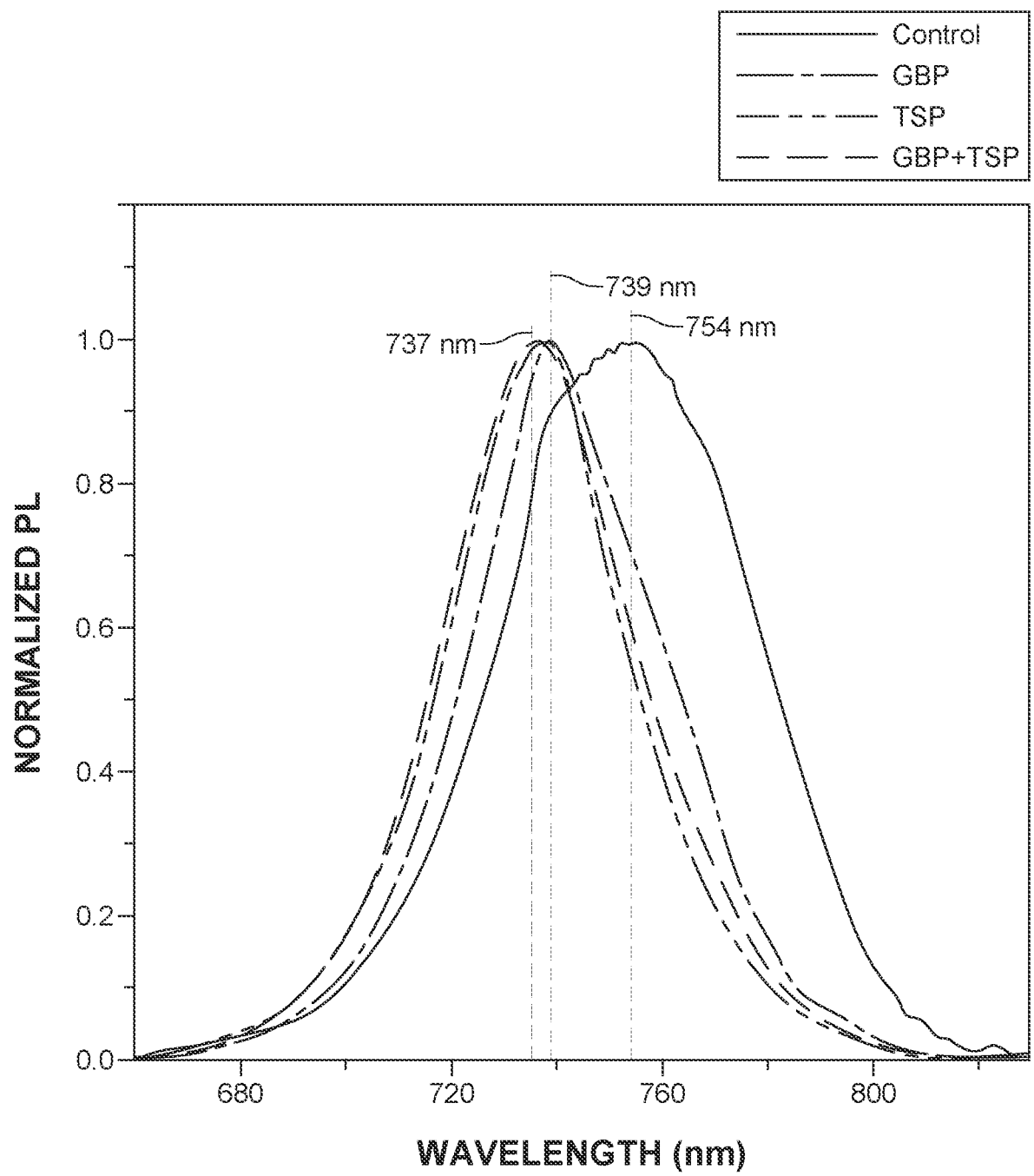
FIG. 11A illustrates the steady-state photoluminescence and FIG. 11B illustrates the time-resolved photoluminescence (TRPL) of control wide-bandgap perovskites when compared to PhenHCl-passivated samples with inter-grain passivation, top surface passivation, and inter-grain and top surface passivations.
Figure 11B:
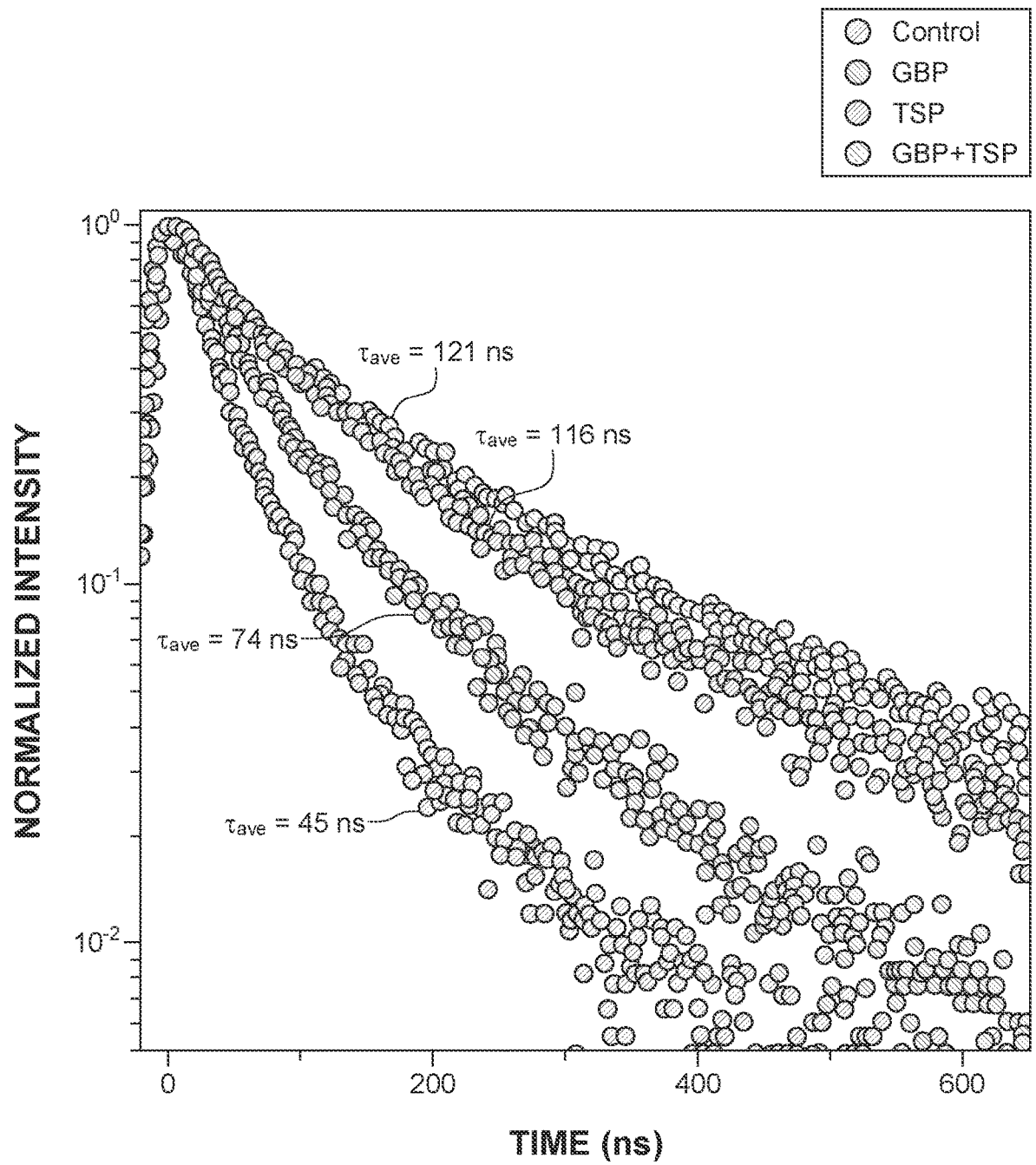

To investigate the passivation effect on charge carrier recombination kinetics of the wide-bandgap perovskite films, photoluminescence (PL) properties of the control and passivated thin films were investigated comparatively. The 2D pseudo-color images revealed that the PL intensity of the films improve significantly when they are passivated with PhenHCl. The highest PL intensity is obtained when a combination of GBP and TSP is employed. Hyperspectral PL imaging of the control and PhenHCl-passivated (GBP+ TSP) thin films confirmed that the PL enhancement is not local but it is uniform. These observations highlight that the PhenHCl passivation strategy is highly effective in reducing non-radiative losses. FIG. 11A compares the normalized steady-state PL intensities. The thin films passivated with TSP and GBP+TSP conditions show the characteristic PL peak at around 738 nm, corresponding to a ~1.68 eV perovskite, matching with the bandgap derived from the EQE measurements. On the other hand, the maximum PL intensity of the control and GBP samples red-shifts to 754 and 739 nm, respectively. The main PL peaks of these samples can be deconvolved into two peaks having maximum emissions at around 740 nm and 760 nm, respectively. These observations suggest that the control and GBP thin films exhibit two different phases of perovskite under light illumination. Although the GBP process is effective in reducing full width half maximum PL of the control sample from ~57 nm to ~43 nm, its deconvolved PL peak shows the existence of a secondary phase of perovskite at ~760 nm. Hence, the TSP or a combination of TSP with GBP is required to suppress the formation of these phases, highlighting the importance of passivation of the perovskite top surface-perovskite-$C_{60}$ interface. The time-resolved PL (TRPL) decay curves shown in FIG. 11B indicate that the PhenHCl-passivation (GBP+TSP) gradually enhances the PL lifetime from 45 ns to 121 ns which is consistent with ~100 mV $V_{OC}$ increment in the devices. In line with the TRPL results, the transient photovoltage decay (TPV) curves of the complete devices also show an increasing trend from 0.79 μs to 1.91 μs with the PhenHCl-passivation (GBP+TSP).

As reported in the literature, light illumination induces phase segregation in wide-bandgap perovskites incorporating mixed iodide and bromide anions. The phase segregation (or halide segregation) is due to the formation of iodide-rich minority and bromide-rich majority domains. The former acts as a recombination center, and thus, reduces particularly $V_{OC}$ of wide bandgap PSCs. In the embodiments discussed herein, the GBP helps to reduce the halide segregation in the perovskite. However, the inventors observed that an additional surface treatment is also desired to overcome this issue. The enhancement in the steady-state PL intensities and TRPL lifetimes after the PhenHCl surface passivation indicates that passivation of the perovskite surface reduces the halide segregation due to a reduced number of surface defects. In line with these findings, it was reported in the literature that perovskite surfaces are an integral part of the halide segregation process; charge accumulation and carrier trapping at perovskite surfaces are the principal drivers of photo-induced halide segregation. Hence, efficient passivation of dangling bonds at perovskite surfaces is a pathway to achieve phase stabilization of wide-bandgap perovskites.

Also, the PhenHCl passivation increases the activation energy required for ions diffuse by ~125 meV with a comparison to the control sample. This restricts ion diffusion in the wide bandgap perovskite film, and thus, surpasses the phase segregation because ion diffusion is necessary for the phase segregation to take place. Furthermore, employing excess halide to the system reduces the density of halide vacancy, which is the main reason for halide migration and segregation. Thus, it is believed that the additional Cl$^-$ ions coming from PhenHCl salt also help to minimize the density of halide vacancies and suppress phase segregation. Therefore, the PhenHCl passivation of both the inter-grain and top surface defects produces the unexpected results of reducing if not preventing the halide phase separation for the reasons discussed above.

Figure 12:
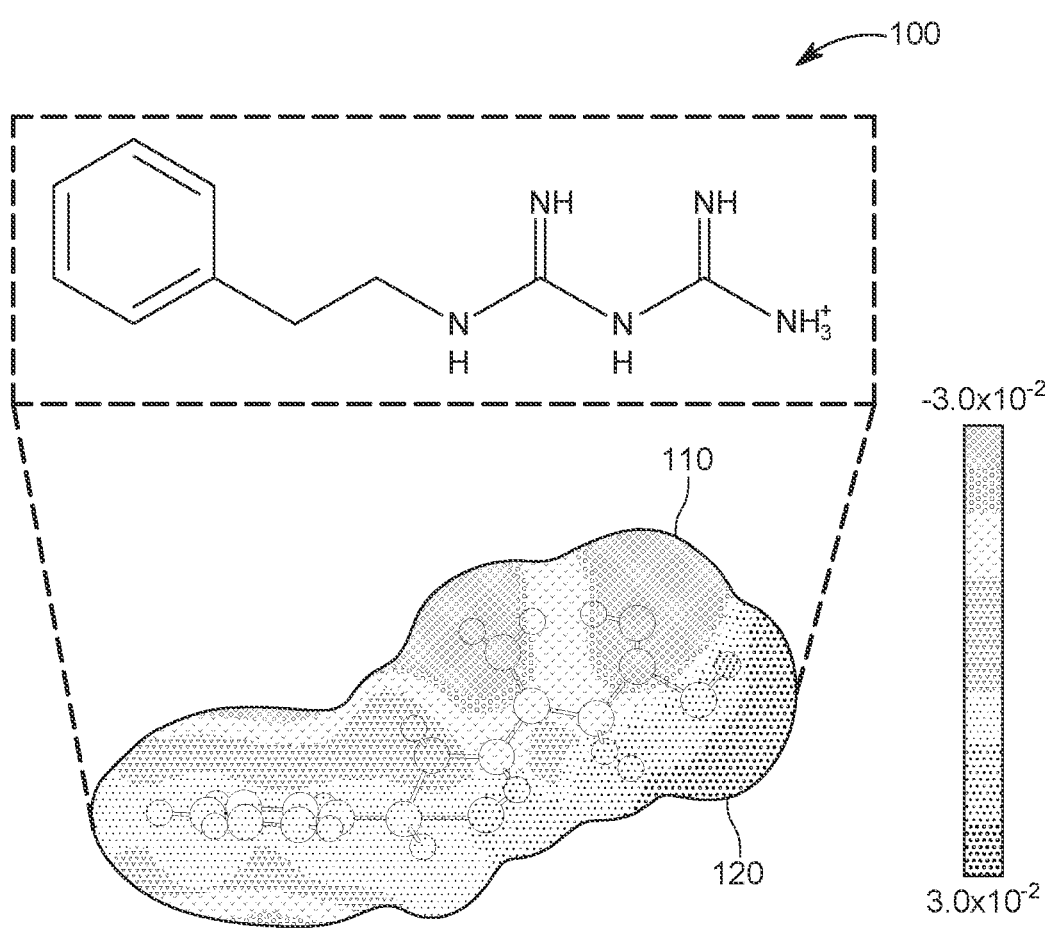
FIG. 12 illustrates the chemical structure and the molecular electrostatic potential map of the PhenH$^+$ molecule.
Figure 13A:
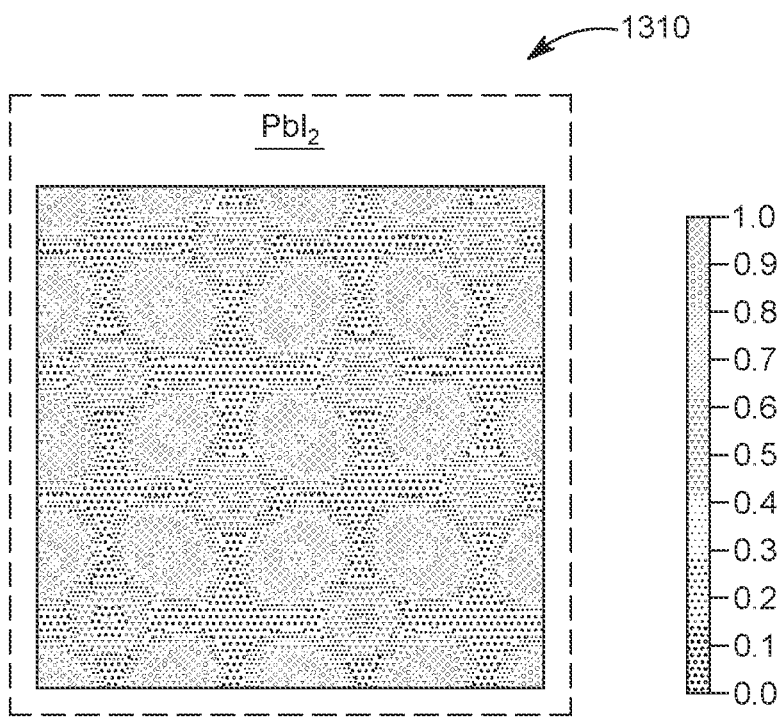
FIGS. 13A to 13C illustrate the top surfaces of $Cs_{0.15}MA_{0.15}FA_{0.70}Pb(I_{0.80}Br_{0.20})_3$ perovskite with PbI$_2$, I-deficient, and Pb-deficient surfaces constructed with DFT, respectively.
Figure 13B:
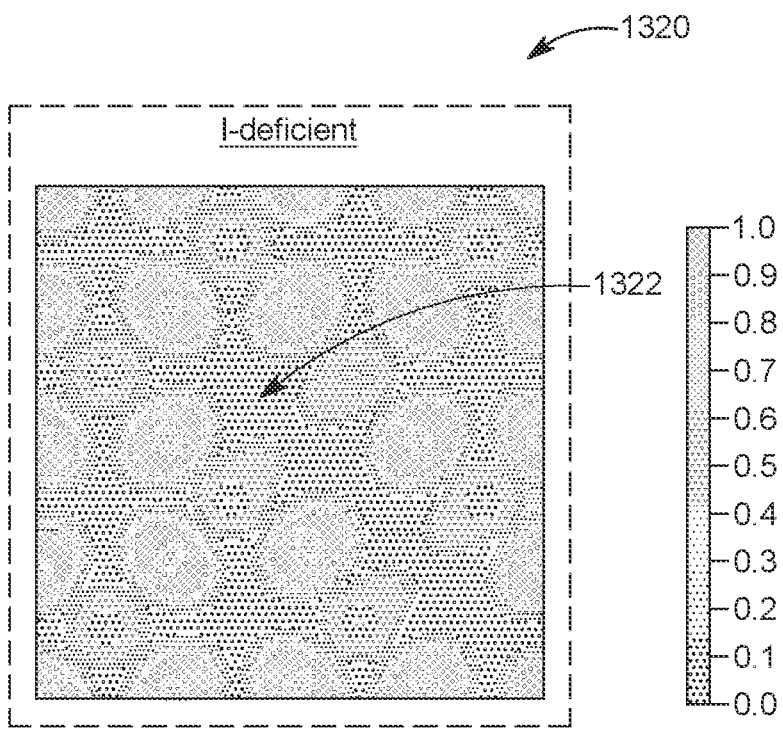
Figure 13C:
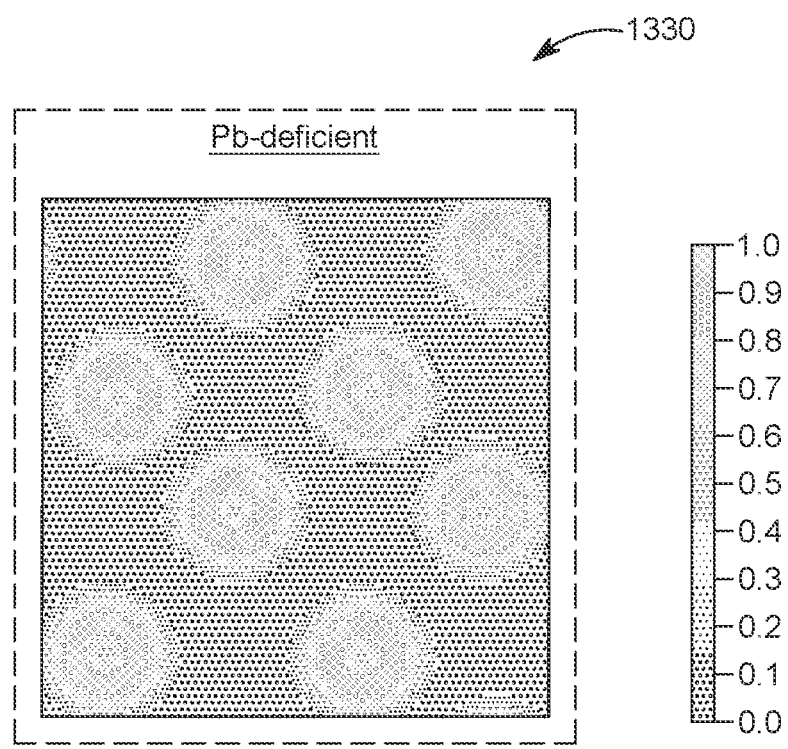

To assess the efficacy of the PhenHCl passivation, the inventors also performed density functional theory (DFT) calculations. FIG. 12 shows the chemical structure (top) and electrostatic potential map (bottom) of the PhenH$^+$ molecule 100. The molecule has various functional groups incorporating electron-rich amine and imine and, electron-poor ammonium groups. The positive charge on the ammonium head group is counterbalanced with an electro-negative chloride anion (Cl$^-$). Owing to these functional groups, the electron clouds surrounding the molecule 100 has an electron-rich domain 110 and an electron-poor domain 120, which are very useful for the passivation of the perovskite surface. To support this, DFT calculations were performed to create a supercell with $Cs_{0.13}MA_{0.13}FA_{0.74}Pb(I_{0.81}Br_{0.19})_3$ composition. This composition is very close to $Cs_{0.15}MA_{0.15}FA_{0.70}Pb(I_{0.80}Br_{0.20})_3$ perovskite 310 used in the devices 300 and 900. This allowed the inventors to run more realistic calculations, which may not be the case when simple perovskites such as $MAPbI_3$ are constructed for DFT calculations instead of real compositions. Three different perovskite surfaces are constructed for the DFT calculations: a perfectly cleaved surface 1310 (missing axial iodide ions) as shown in FIG. 13A, a highly under-coordinated Pb surface 1320 (highly iodide-deficient surface as indicated by arrow 1322) as shown in FIG. 13B, and a highly under-coordinated I surface 1330 (highly Pb-deficient surface) as shown in FIG. 13C. These surfaces are abbreviated as $PbI_2$, I-deficient, and Pb-deficient surfaces, respectively. Electron density profiles of these surfaces are shown in the corresponding figure. The profiles highlight that the perovskite surfaces are made of a blend of electron-rich and -poor domains, the distribution of which are highly influenced by the surface defects. Since it is very difficult to control the nature of surface defects of metal-halide perovskites, multifunctional molecules like PhenHCl, incorporating electron-rich and -poor groups, are expected to be more successful for full passivation of the surface defects. Otherwise, a highly electro-positive (electro-negative) molecule will simply be repelled from an electron-poor (electron-rich) perovskite surface domain due to the unfavorable electrostatic interaction.

Figure 14A:
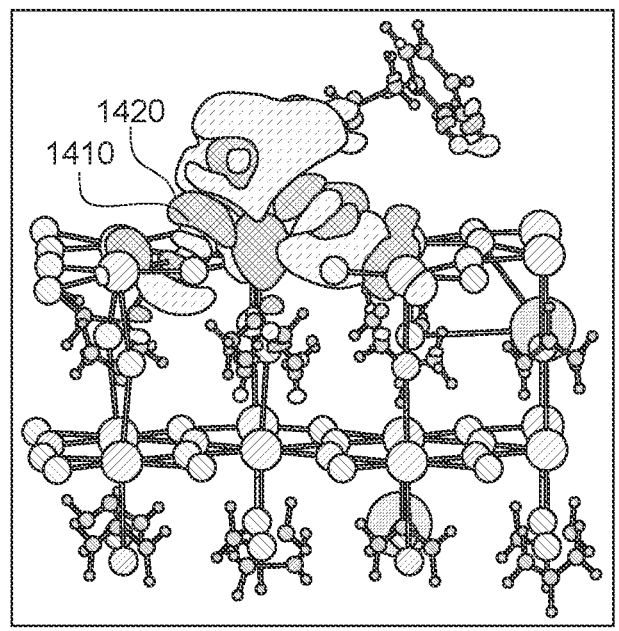
FIGS. 14A to 14C illustrate the PbI$_2$, I-deficient, and Pb-deficient top surfaces passivated with the PhenH molecules.
Figure 14B:
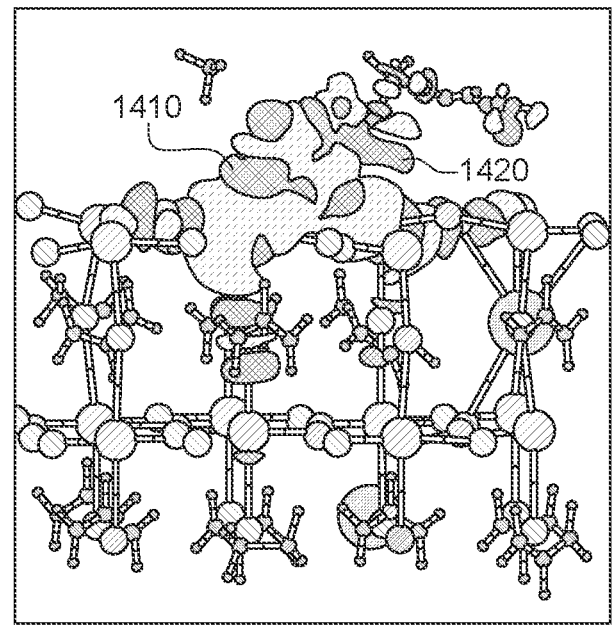
Figure 14C:
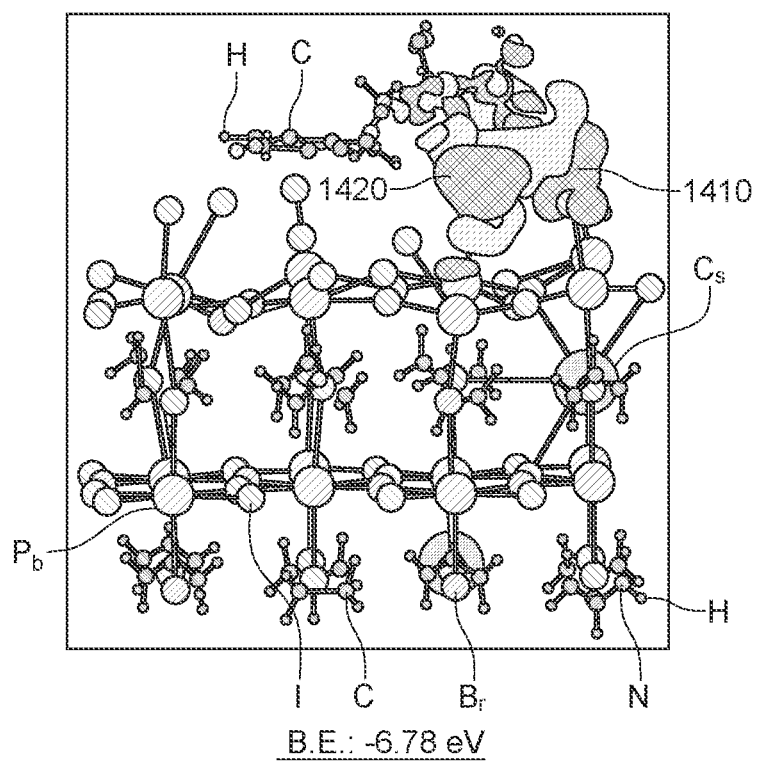

Next, the inventors investigated the interaction of the PhenH$^+$ with these surfaces, respectively, as illustrated in FIGS. 14A to 14C, and the binding energies (B.E.) and Bader charge values were calculated. The highest binding energy is obtained with the Pb-deficient surface (-6.78 eV), followed by the I-deficient (-3.84 eV) and $PbI_2$ (-1.67 eV) surfaces. These values are also reflected in the Bader charge values as a positive value indicates that the charge is transferred from the molecule to the surface. Moreover, the charge density difference is calculated to understand the nature of the bonding between the molecule and surface. The regions 1410 and 1420 in FIGS. 14A to 14C represent charge depletion and accumulation, respectively. It is noted that PhenH$^+$ can reorient itself (see the various orientations in FIGS. 14A to 14C), depending on the nature of surface defect, and therefore, can passivate any kind of perovskite surface dangling bonds. Its electron-deficient $NH_3^+$ group mostly interacts with electro-negative surface iodine atoms, whereas, the electron-rich amine and imine nitrogen atoms mostly interact with the electron-poor Pb surface atoms. Interestingly, in the case of an I-deficient surface, the calculations show that the $NH_3^+$ group detaches from the PhenH$^+$. Hence, the interaction is originated through the amine and imine groups in the molecule with the under-coordinated Pb atom, which makes the highest binding. The charge density profiles also suggest that one PhenH$^+$ molecule can simultaneously passivate a multitude of the surface dangling atoms. Apart from this, the counter Cl$^-$ anion of the molecule detaches upon solvation and can passivate under-coordinated Pb surface atoms.

The inventors also investigated the partial density of states (DOS) of the surface atoms (normalized for the number of surface atoms) with and without PhenH$^+$ surface passivation. The high binding nature for all the systems has been analyzed through the strong hybridization between the surface I and Br atoms with PhenH$^+$ in the valence band maximum (VBM). The conduction band is occupied by the strong orbital hybridization of Pb and PhenH$^+$. The high binding energy for the molecule in the system mimics the stable passivation on the $Cs_{0.13}MA_{0.13}FA_{0.74}Pb(I_{0.81}Br_{0.19})_3$. The DOS graphs (not shown) indicate that in-gap states which originate from the surface dangling bonds are effectively suppressed after the PhenH$^+$ passivation for all of the surfaces.

The inventors also compared the DFT results of PhenH$^+$ passivation with PEA$^+$. The inventors observed that, unlike PhenH$^+$, PEA$^+$ does not exhibit an electron-rich domain on its phenyl alkyl backbone. Although its phenyl ring's core is highly electron-rich, the surface of the phenyl ring is highly non-polar, preventing an effective passivation of electropositive perovskite surface defects. The binding energy calculations and charge density difference plots (not shown) show that PEA$^+$ can passivate the $PbI_2$ and Pb-deficient surfaces as efficient as PhenH$^+$. However, in the case of the I-deficient surface, its binding energy (−1.68 eV) is less than half of the PhenH$^+$ case. In fact, it attaches to the I-deficient surface by interacting with the surface I atoms. Since the density of I atoms are less on the I-deficient surface, the surface I atoms are tilted to adjust the PEA$^+$ molecule, which puts stress on the I atoms, and consequently, may not be advantageous for device stabilities. In cases where there is no surface I atoms surrounding a Pb dangling bond, the PEA$^+$ is expected to be repelled from the surface because it lacks functional electro-negative groups. The weakness of the PEA$^+$ for passivating the I-deficient surface is also reflected in the DOS calculations due to the existence of in-gap states. These results are highly significant because a hybrid metal-halide perovskite surface is expected to have more I-deficient character if a post-treatment is not applied. This is because volatile halide species are expected to gas-out preferentially from the surface (in the form of HX or $X_2$; X: I and/or Br) during the annealing process. Hence, it is believed that multi-functional molecules like PhenHCl, which incorporates electron-rich and -poor functional groups, are more effective for passivation of metal halide perovskite dangling bonds instead of commonly used organic ammonium salts such as phenylethylammonium, butylammonium, allylammonium and benzylammonium halides.

As discussed earlier in this disclosure, the PhenHCl molecule was used in all the embodiments as an example as its structure is well understood. However, other molecules that share the features of the "passivation molecule" 100 defined above can be used for the inter-grain and top surface passivations. Unlike the previously reported perovskite passivation strategies, the passivation molecules discussed herein can provide at least one of a multitude of benefits as now discussed.

The passivation molecules described in FIG. 1 are highly versatile in terms of their chemical compositions. Thus, they can be modified in such a way that they can be used to passivate different perovskite compositions and structures with different bandgaps from 1.1 eV to 3.0 eV.

The proposed passivation molecules incorporate electron-rich and -poor domains. Hence, they can effectively and concurrently passivate cationic and anionic perovskite defects.

As discussed above with regard to the DFT results, they can passivate different types of perovskite surfaces, independent of the chemical composition of the perovskite defects or dangling bonds.

The passivation molecules can also improve the phase purity and stability of the perovskites by preventing the halide segregation phenomenon mix halide wide bandgap perovskites.

The tail, backbone, pendant, and head groups of the passivation molecules can be chemically tuned to enable effective charge transfer from the perovskite layer to charge transport layers, or vice versa. Depending on the chemical nature of these groups, the passivation molecules can be conductive, semiconductive, or insulator. If the passivation molecule has an insulating character, the passivation layer should be very thin (<5 nm) so that the charge carriers can tunnel the passivation layer.

The passivation molecules can change the electronic structure of the perovskites. Particularly, the chemical flexibility of the passivation strategy paves the way to tune energy levels (conduction band minimum, valance band maximum, and work function) of semiconducting metal halide perovskites for target applications. This can widen the applicability of metal halide perovskites for semiconductor and electronic device applications. For instance, it is known that the capsaicin molecule can significantly decrease the work function of metal halide perovskite from −4.95 eV to −4.48 eV, by changing the perovskite surface from p-type to n-type. The proposed multifunctional molecules shown in FIGS. 1 to 2F can also alter perovskite energetics in the same manner.

Depending on the chemical nature of the passivation molecules, the surface energy of the metal halide perovskites can be tuned accordingly to obtain metal halide perovskites with very low surface energy (hydrophobic surface, water contact angle higher than 90°). This significantly improves the stability of the metal halide perovskites as they are prone to be degraded by moisture and/or oxygen. For instance, if the R' groups on the tail phenyl ring shown in FIG. 2A includes fluoride atoms, this will make the surface hydrophobic.

The thickness of the passivation layer can be tuned by adjusting the concentration of the passivation molecule in the solution. If the passivation molecule is evaporated, the thickness can be tuned by adjusting the evaporation time and/or speed. Depending on the application, the thickness of the passivation layer can be tuned from a monolayer to about 20 nm.

Figure 15A:
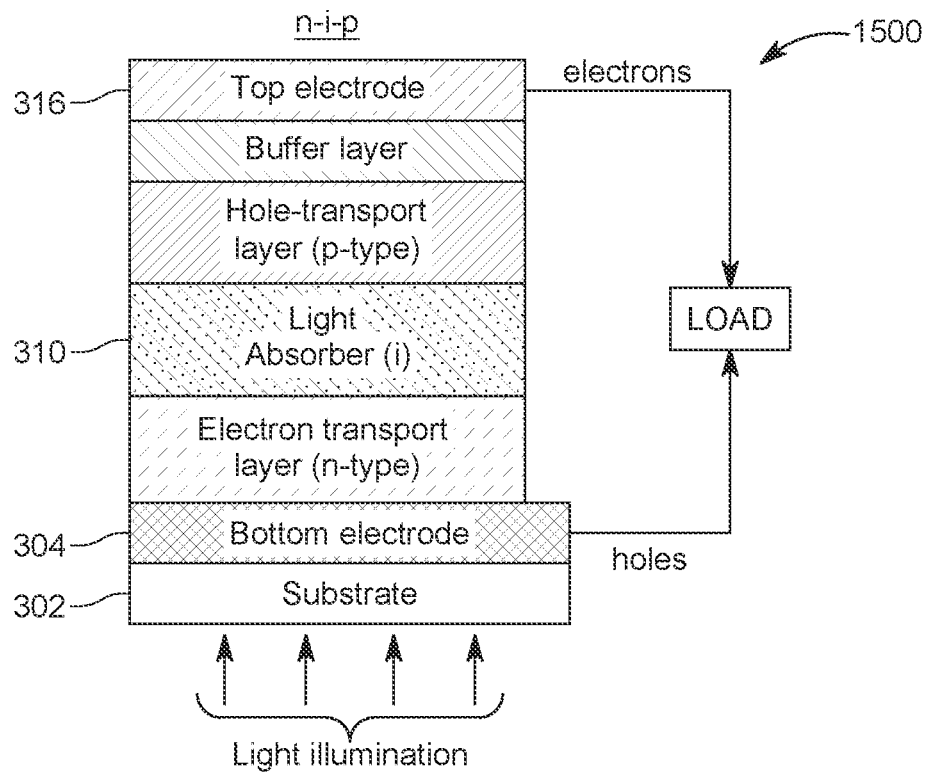
FIGS. 15A to 15J illustrate various semiconductor devices that use a metal halide perovskite passivated with the passivation molecules illustrated in FIG. 1.
Figure 15B:
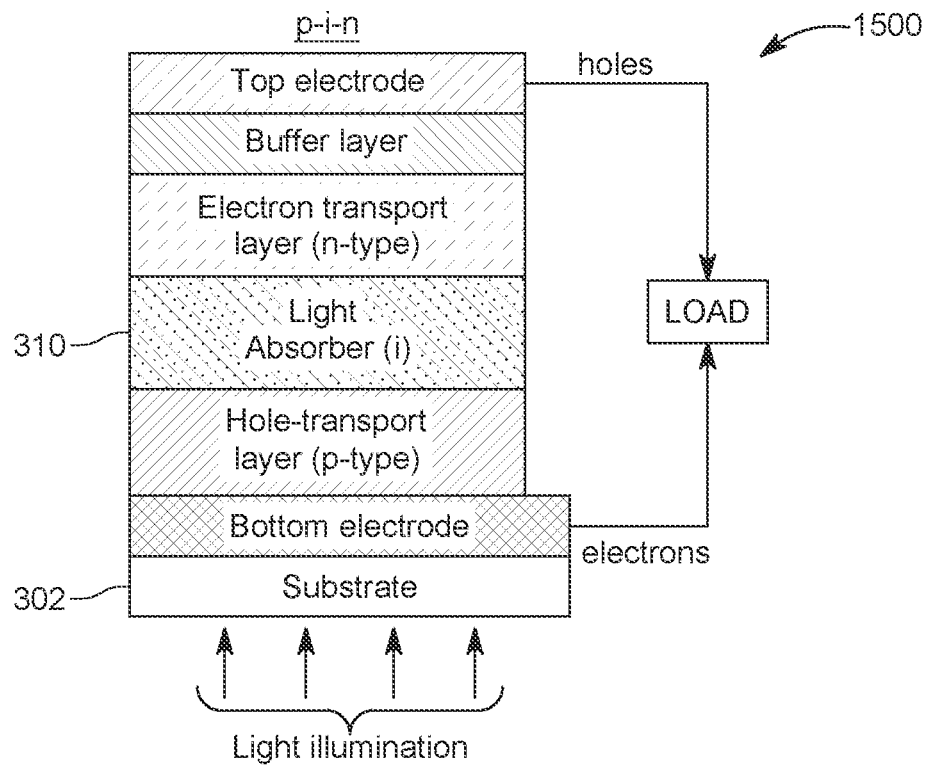
Figure 15C:
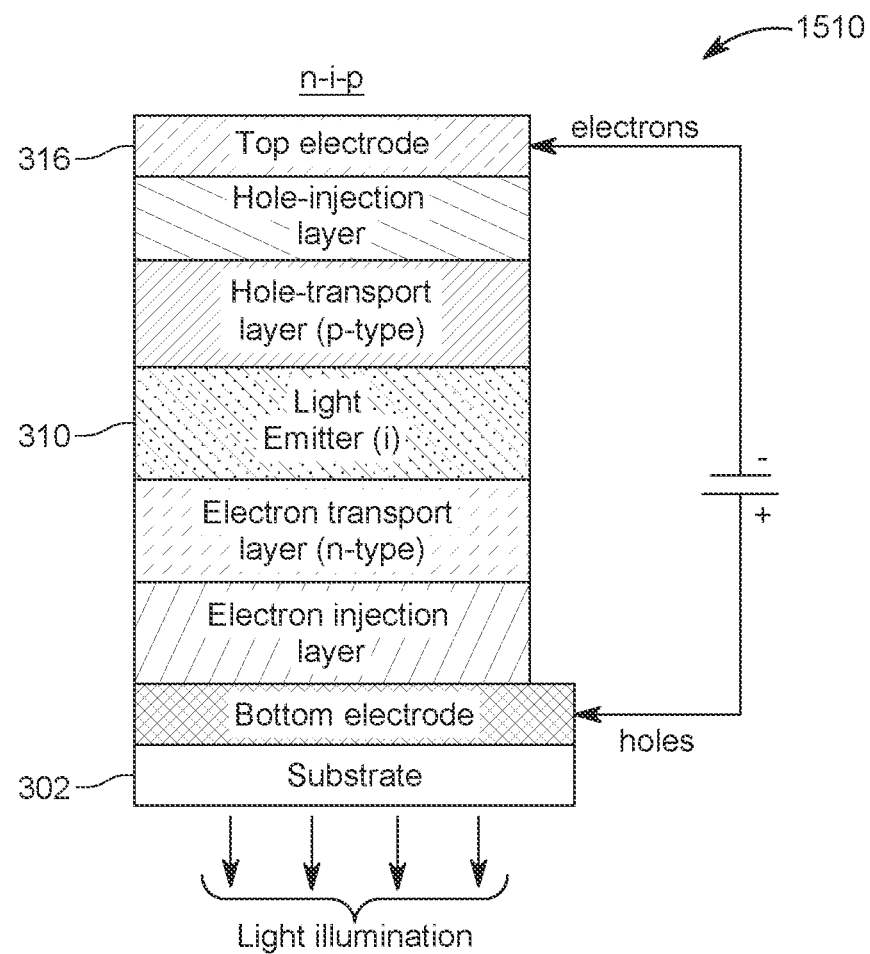
Figure 15D:
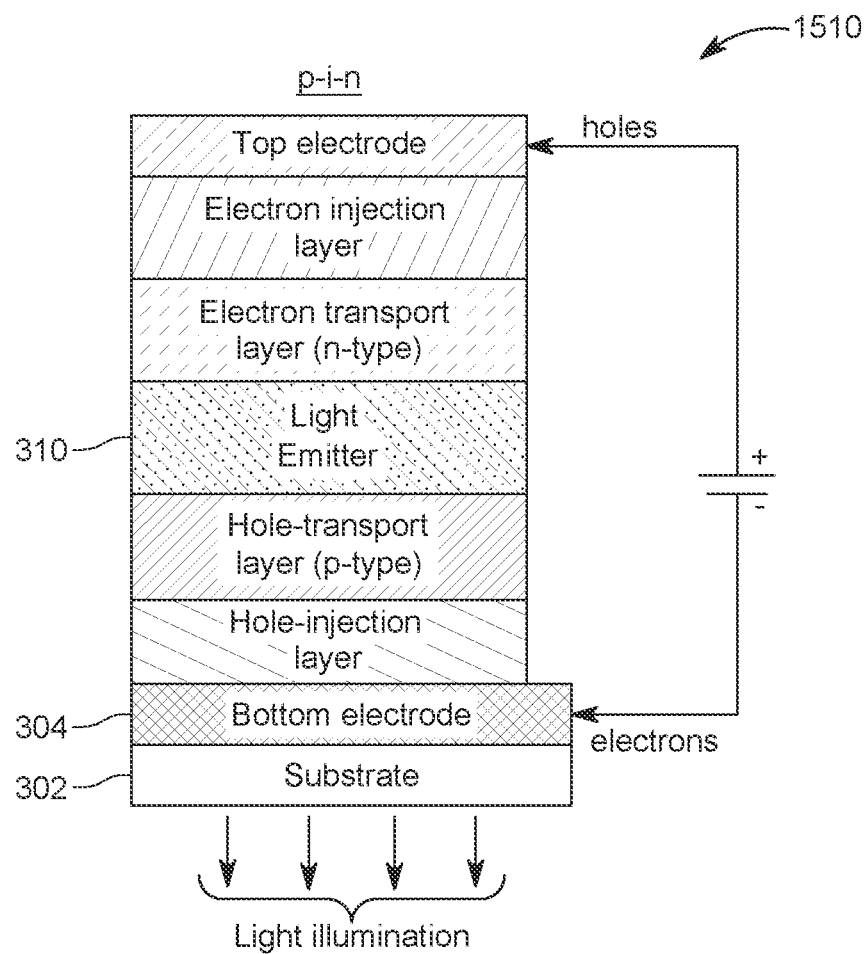
Figure 15E:
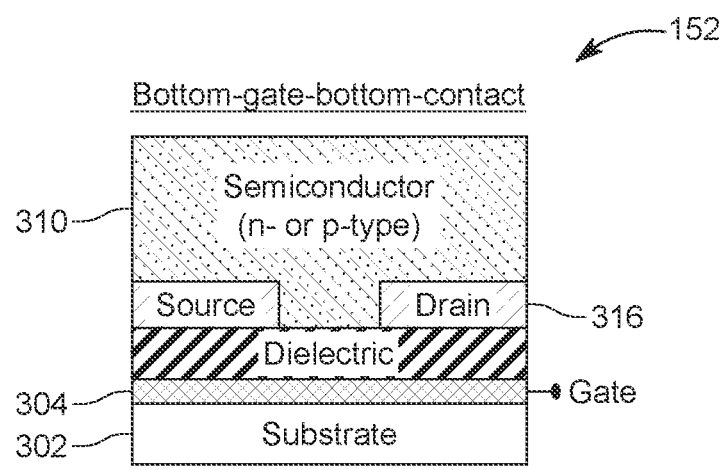
Figure 15F:
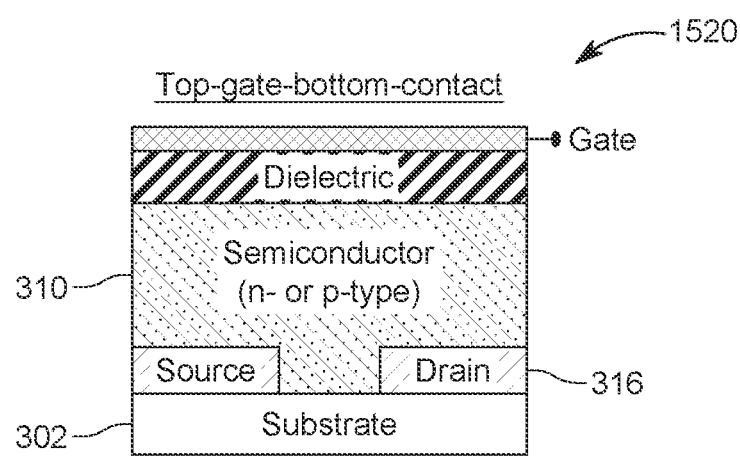
Figure 15G:
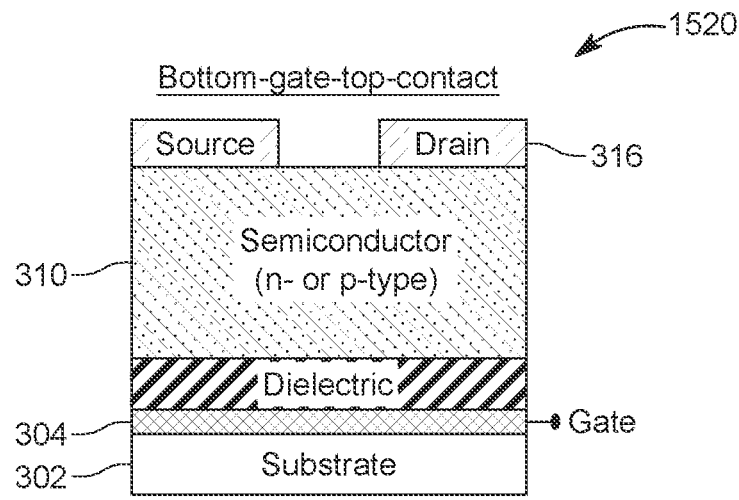
Figure 15H:
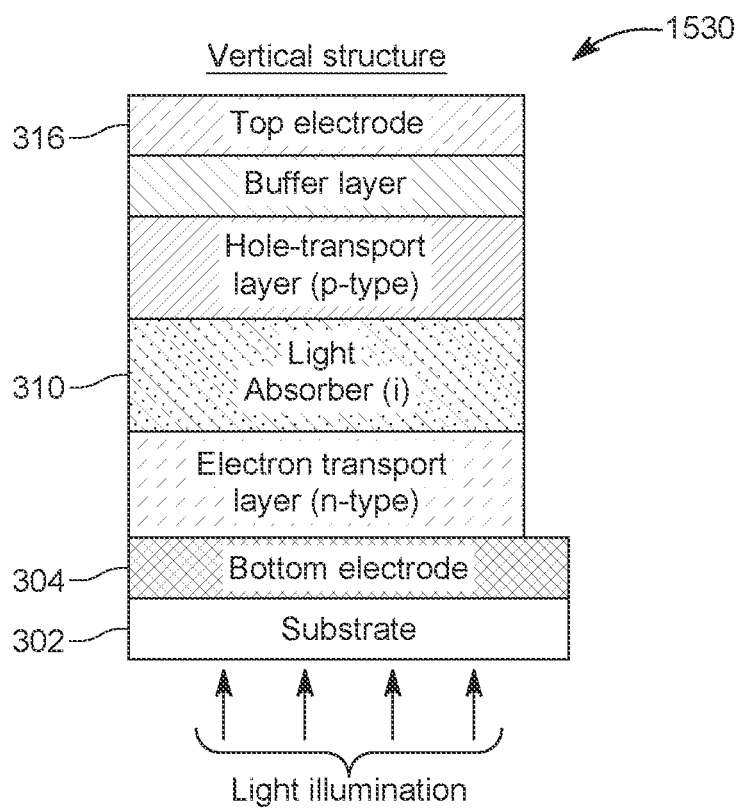
Figure 15I:
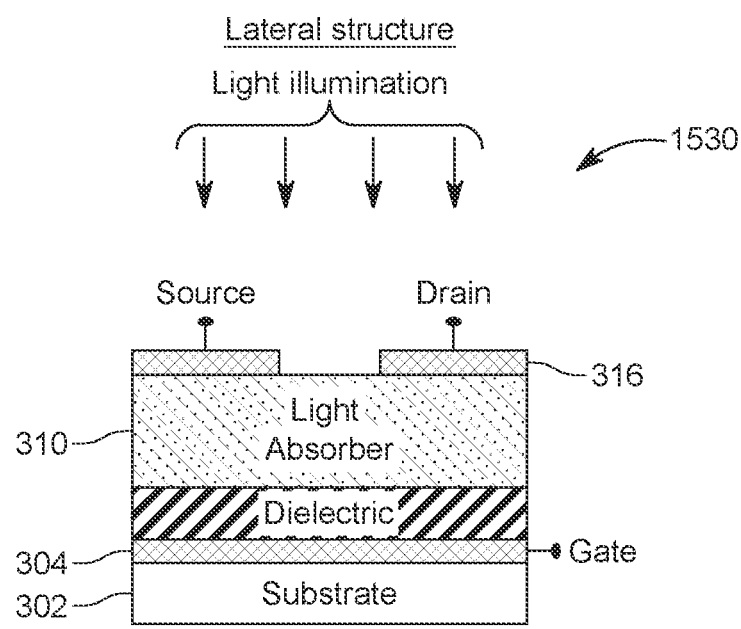
Figure 15J:
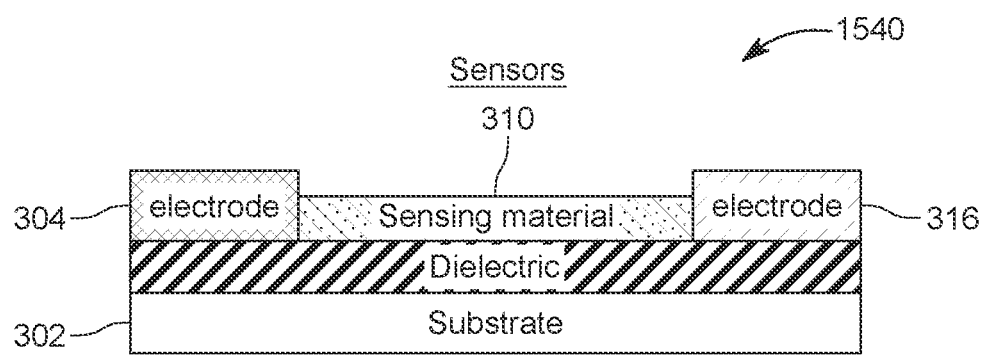

The novel passivated metal halide perovskite layer 310 discussed herein finds applications in the field of renewable energies and semiconductor industries, where the metal halide perovskites have a huge potential. Specifically, one or more of the embodiments can find applications in the fabrication of solar cells 1500 (see FIGS. 15A and 15B), light-emitting diodes 1510 (see FIGS. 15C and 15D), transistors 1520 (see FIGS. 15E-15G), photo-detectors 1530 (see FIGS. 15H and 15I), sensors 1540 (see FIG. 15J), and any flexible electronics as the metal halide perovskites 310 are a part of such devices. In each of these devices, the metal halide perovskite layer 310 can be used as light-absorbing materials, light-emitting materials, semiconducting materials, or sensing material. For the solar cells 1500, they can have an n-i-p or a p-i-n structure with respect to light illumination. Similarly, they can be used for the fabrication of light-emitting diodes 1510 having either an n-i-p or a p-i-n structure with respect to illuminated light direction. Moreover, metal halide perovskites can be used as semiconducting materials for the fabrication of transistors 1520, which can have different device structures as illustrated in FIGS. 15E to 15G. For photodetector applications, the metal halide perovskite layer 310 can be used as light absorbers for the fabrication of photo-detectors 1530 with vertical or lateral structures, as shown in FIGS. 15H and 15I. It should be noted that the vertical structure can have a p-i-n or n-i-p structure with respect to light illumination. Photodetectors based on the vertical structure include photodiodes (also called photodiode-type photodetectors) and photo-multiplication (or called gain)-type photodetectors; whereas, photodetectors based on the lateral structure include photoconductors and phototransistors. All photoconductors, photodiodes, and photomultiplication-type photodetectors are two-terminal devices with an anode and cathode. In contrast, phototransistors are three-terminal devices with source, drain, and gate electrodes. Finally, the metal halide perovskite layer 310 can be used as a sensing material for the fabrication of sensors 1540, as illustrated in FIG. 15J. Note that the metal halide perovskite layer 310 in these embodiments does not have to include only the PhenHCl molecule. Other passivation molecules 100 may be used as previously discussed. Also, the layer 310 may have only top surface passivation, only inter-grain passivation, or both passivations.

Figure 16:
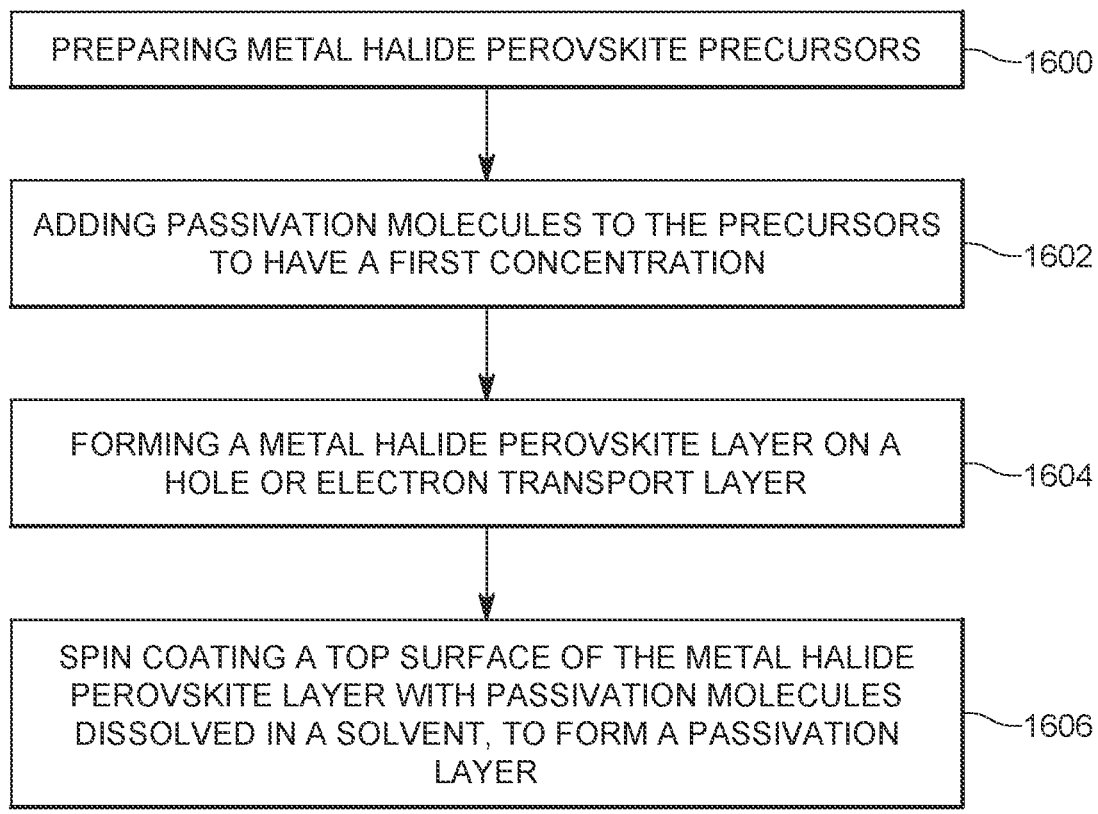
FIG. 16 is a flow chart of a method for passivating the metal halide perovskite layer.

A method for passivating a semiconductor device 300 is now discussed with regard to FIG. 16. The method includes a step 1600 of preparing metal halide perovskite precursors, a step 1602 of adding passivation molecules 100 to the precursors to have a first concentration, a step 1604 of forming a metal halide perovskite layer 310 on a hole or electron transport layer, and a step 1606 of solution processing (e.g., spin coating, blade coating, slot-die coating, etc.) a top surface of the metal halide perovskite layer 310 with passivation molecules dissolved in a solvent, to form a passivation layer. The passivation molecules have a second concentration in the solvent, which is different from the first concentration. The other method steps previously discussed for forming the semiconductor device 300 may be combined with the steps of this method.

The disclosed embodiments provide a semiconductor device in which a passivation molecule is used to passivate inter-grain and/or top surface defects in a metal halide perovskite. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

The entire content of all the publications listed herein is incorporated by reference in this patent application.

[1] A. Zaher, S. Li, O. Yassine, N. Khashab, N. Pirmoradi, L. Lin, J. Kosel: "Osmotically driven drug delivery through remote-controlled magnetic nanocomposite membranes". *Biomicrofluidics*, vol. 9, no. 5, p. 054113, 2015.

[1] M.-H. Li, H.-H. Yeh, Y.-H. Chiang, U.-S. Jeng, C.-J. Su, H.-W. Shiu, Y.-J. Hsu, N. Kosugi, T. Ohigashi, Y.-A. Chen, P.-S. Shen, P. Chen, T.-F. Guo, (2018), Highly Efficient 2D/3D Hybrid Perovskite Solar Cells via Low-Pressure Vapor-Assisted Solution Process, *Advanced Materials*, 30, 1801401.

[2] W. Ke, L. Mao, C. C. Stoumpos, J. Hoffman, I. Spanopoulos, A. D. Mohite, M. G. Kanatzidis, (2019), Compositional and Solvent Engineering in Dion-Jacobson 2D Perovskites Boosts Solar Cell Efficiency and Stability, *Advanced Energy Materials*, 9, 1803384.

[3] Z. Wang, Q. Lin, F. P. Chmiel, N. Sakai, L. M. Herz, H. J. Snaith, (2017), Efficient ambient-air-stable solar cells with 2D-3D heterostructured butylammonium-caesium-formamidinium lead halide perovskites, *Nat. Energy*, 2, 17135.

[4] S. Gharibzadeh, B. Abdollahi Nejand, M. Jakoby, T. Abzieher, D. Hauschild, S. Moghadamzadeh, J. A. Schwenzer, P. Brenner, R. Schmager, A. A. Haghighirad, L. Weinhardt, U. Lemmer, B. S. Richards, I. A. Howard, U. W. Paetzold, (2019), Record Open-Circuit Voltage Wide-Bandgap Perovskite Solar Cells Utilizing 2D/3D Perovskite Heterostructure, *Advanced Energy Materials*, 9, 1803699.

[5] M. De Bastiani, A. S. Subbiah, E. Aydin, F. H. Isikgor, T. G. Allen, S. De Wolf, (2020), Recombination junctions for efficient monolithic perovskite-based tandem solar cells: physical principles, properties, processing and prospects, *Mater. Horiz.*, 7, 2791-2809.

What is claimed is:

1. A semiconductor device comprising:
a substrate;
a first electrode located on the substrate;
a metal halide perovskite layer located on the first electrode;
a second electrode located on the metal halide perovskite layer; and
passivation molecules that passivate the metal halide perovskite layer, the passivation molecules having a head group, a backbone group, and a tail group, the backbone group being connected to each of the head group and the tail group, the tail group including a phenyl ring, and the head group having an electron rich-domain and an electron-poor domain, with the electron rich-domain having higher valence electron concentration than the electron-poor domain, wherein the metal halide perovskite layer has (1) a top surface defect located in a top surface and (2) an inter-grain defect located at an interface between two adjacent grains, wherein the passivation molecules passivate at least one of the top surface defect and the inter-grain defect, and wherein the passivation molecules include a phenyl tail group, two =NH pendant groups, and an $NH_3^+Cl^-$ head group attached to a —$CH_2$—$CH_2$—NH—C—NH—C— backbone group.

2. The semiconductor device of claim 1, wherein the passivation molecules passivate both the top surface defect and the inter-grain defect.

3. The semiconductor device of claim 1, wherein the passivation molecules that passivate the inter-grain defect are fully embedded into the metal halide perovskite layer.

4. The semiconductor device of claim 1, wherein the passivation molecules that passivate the top surface defect are in direct contact with an adjacent layer of the semiconductor device.

5. The semiconductor device of claim 4, wherein the adjacent layer is C60.

6. The semiconductor device of claim 1, wherein the tail group includes at least a phenyl circle.

7. The semiconductor device of claim 1, wherein the tail group has first and second domains, wherein the first domain has a higher valence electron concentration than the second domain.

8. The semiconductor device of claim 6, wherein the passivation molecules further include a pendant group.

9. The semiconductor device of claim 1, wherein the metal halide perovskite is $Cs_{0.15}MA_{0.15}FA_{0.70}Pb(I_{0.80}Br_{0.20})_3$, with MA being methylammonium and FA being formamidinium.

10. The semiconductor device of claim 1, wherein the semiconductor device is one of a solar cell, light emitting device, transistor, photodetector, and a sensor.

11. The semiconductor device of claim 1, wherein the substrate has a textured surface and the metal halide perovskite layer has a bottom surface that matches the textured surface of the substrate.

12. A solar cell comprising:
a substrate;
a first electrode located on the substrate;
a hole transport layer located on the first electrode;
a metal halide perovskite layer located on the hole transport layer;
an electron transport layer located on the metal halide perovskite layer;
a second electrode located on the electron transport layer; and
passivation molecules that passivate the metal halide perovskite layer, the passivation molecules having a head group, a backbone group, and a tail group, the backbone group being connected to each of the head group and the tail group, the tail group including a phenyl ring, and the head group having an electron rich-domain and an electron-poor domain, with the electron rich-domain having higher valence electron concentration than the electron-poor domain, wherein the metal halide perovskite layer has (1) a top surface defect located in a top surface and (2) an inter-grain defect located at an interface between two adjacent grains, wherein the passivation molecules passivate at least one of the top surface defect and the inter-grain defect, and wherein the passivation molecules include a phenyl tail group, two =NH pendant groups, and an $NH_3^+Cl^-$ head group attached to a —$CH_2$—$CH_2$—NH—C—NH—C— backbone group.

13. The solar cell of claim 12, wherein the passivation molecules passivate both the top surface defect and the inter-grain defect.

14. The solar cell of claim 12, wherein the tail group has first and second domains, wherein the first domain has a higher valence electron concentration than the second domain, and wherein the passivation molecules further include a pendant group.

15. The solar cell of claim 12, wherein the metal halide perovskite is $Cs_{0.15}MA_{0.15}FA_{0.70}Pb(I_{0.80}Br_{0.20})_3$, with MA being methylammonium and FA being formamidinium.

16. A semiconductor device comprising:
a substrate;
a first electrode located on the substrate;
a metal halide perovskite layer located on the first electrode;
a second electrode located on the metal halide perovskite layer; and
passivation molecules that passivate the metal halide perovskite layer, wherein the metal halide perovskite layer has (1) a top surface defect located in a top surface and (2) an inter-grain defect located at an interface between two adjacent grains, wherein the passivation molecules passivate at least one of the top surface defect and the inter-grain defect, and wherein the passivation molecules include a phenyl tail group, two =NH pendant groups, and an $NH_3^+Cl^-$ head group attached to a —$CH_2$—$CH_2$—NH—C—NH—C— backbone group.

* * * * *